(12) United States Patent
Kobayashi et al.

(10) Patent No.: US 7,266,482 B2
(45) Date of Patent: *Sep. 4, 2007

(54) COMPUTER-AIDED DESIGNING ASSISTANT APPARATUS AND METHOD OF ASSISTING DESIGNING OF ENVIRONMENTALLY CONSCIOUS PRODUCT

(75) Inventors: Hideki Kobayashi, Kanagawa (JP); Seizo Doi, Tokyo (JP); Kazuhito Haruki, Kanagawa (JP); Akinori Hongu, Kanagawa (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 523 days.

This patent is subject to a terminal disclaimer.

(21) Appl. No.: 10/880,528

(22) Filed: Jul. 1, 2004

(65) Prior Publication Data

US 2004/0236551 A1 Nov. 25, 2004

Related U.S. Application Data

(62) Division of application No. 09/321,545, filed on May 28, 1999, now Pat. No. 6,811,344.

(30) Foreign Application Priority Data

Feb. 3, 1999 (JP) ................................. 11-026581

(51) Int. Cl.
G06F 17/10 (2006.01)
G06F 19/00 (2006.01)
G06G 7/48 (2006.01)
(52) U.S. Cl. ................................ 703/6; 703/2; 700/97
(58) Field of Classification Search .................... 703/2, 703/6; 700/97
See application file for complete search history.

(56) References Cited

OTHER PUBLICATIONS

Y. (Paul) Zhang, et al., Proceedings of DETC '98, 1998 ASME Design Engineering Technical Conferences, pp. 1-9, "Life Cycle Design With Green QFD-II", Sep. 13-16, 1998.
IEEE Proceedings Frist International Symposium on Environmentally Conscious Design and Inverse Manufacturing; pp. v-xx; Feb. 1, 1999.
Tu et al.; "The ecodesign strategy on product research and development from the life-cycle design"; IEEE, EcoDesign '99; pp. 351-356; Feb. 1, 1999.

Primary Examiner—Hugh Jones
(74) Attorney, Agent, or Firm—Oblon, Spivak, McClelland, Maier & Neustadt, P.C.

(57) ABSTRACT

Disclosed is a computer-aided product designing assistant apparatus and method for assisting designing of an environmentally conscious product by presenting at least one design guideline to be adopted in designing the environmental counscious product. The apparatus comprises: a database storing a plurality of design guidelines for each product and evaluation values assigned to each design guideline in relation to a plurality of environmental issues and a plurality of phases defining a life cycle of products, the evaluation values assigned to each design guideline being capable of indicating an effectiveness of each design guideline in resolving each environmental issue at each phase of the life cycle, each environmental issue respectively representing an issue to be resolved in order to reduce environmental load due to each product; and a processing unit for determining a relative importance level of each environmental issue at each phase of the life cycle for a product to be designed, selecting at least one design guideline for the product to be designed from said plurality of design guidelines stored in the database according to the evaluation values stored in the database and the relative importance level of each environmental issue at each phase of the life cycle determined for the product to be designed, and presenting said at least one design guideline selected for the product to be designed.

15 Claims, 39 Drawing Sheets

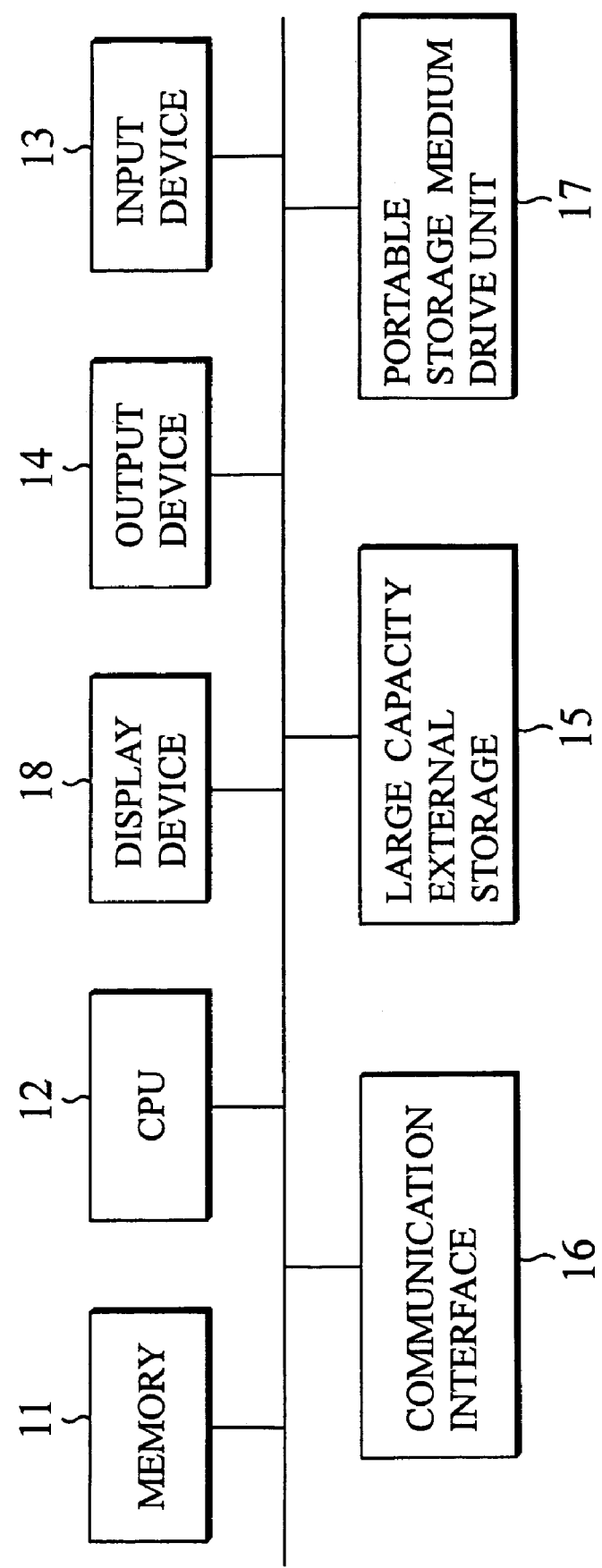

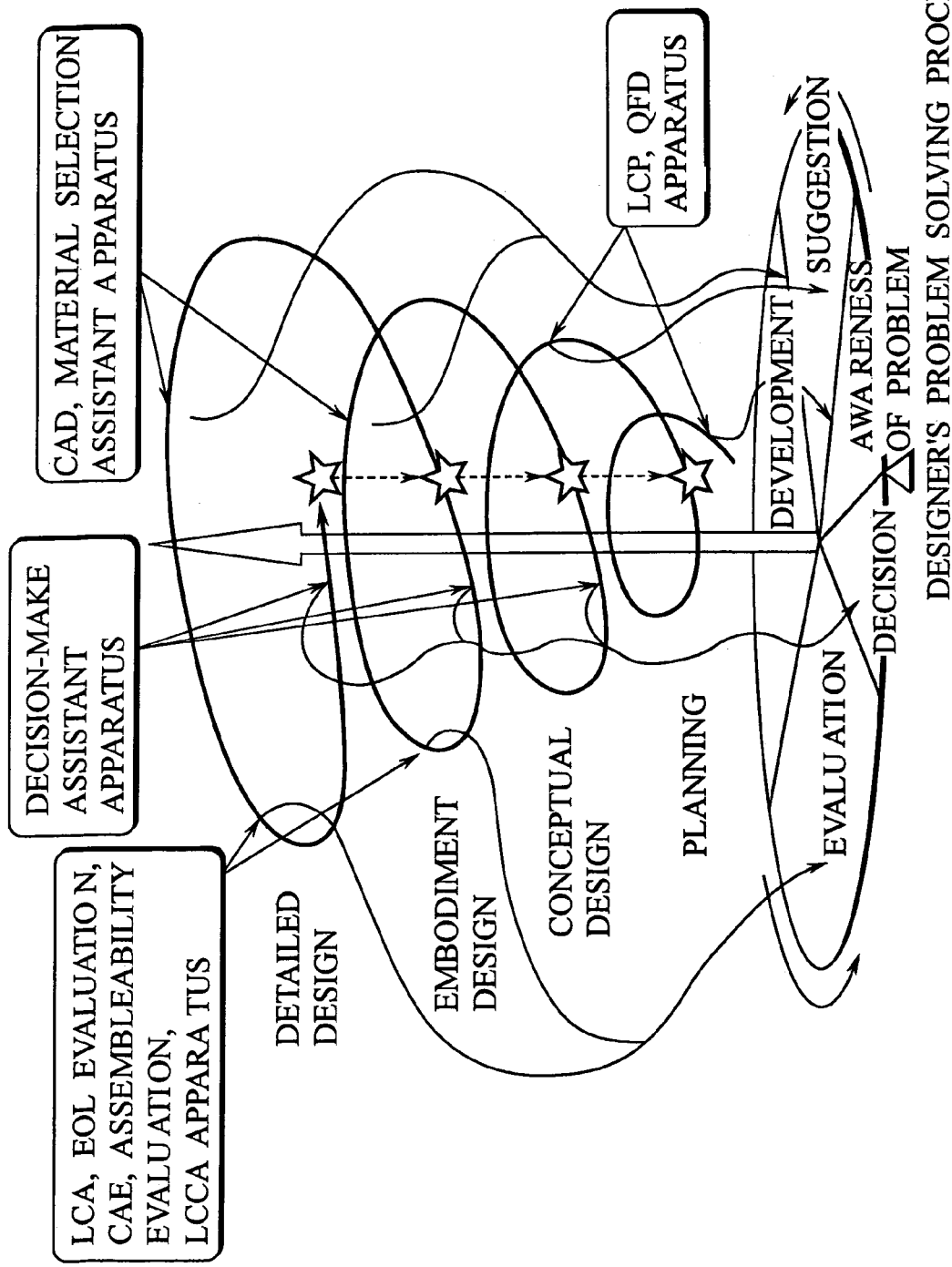
FIG.4 RELATIONSHIP BETWEEN DESIGNING PROCESS AND SYSTEM UNITS

FIG.5

EXAMPLE OF MATRIX CONTENTS
(LIFE CYCLE PROCESS VS. ENVIRONMENTAL ISSUES)

| | MATERIAL ACQUISITION | MANUFACTURING | DISTRIBUTION | USE | DISPOSAL |
|---|---|---|---|---|---|
| RESOURCE SAVING | | LIFE EXTENDING | | | LEGAL REGULATION A |
| ENERGY SAVING | SUPPLY FREQUENCY | ENERGY SAVING PROCESS | | ELECTRICITY SAVING MODE IMPROVING | |
| WASTE REDUCTION | RECYCLABLE PLASTIC | | PACKING REDUCTION | | |
| HARMFULNESS REDUCTION | LEGAL REGULATION B | | | | |
| ENVIRONMENTAL IMPACT | | CLEAN MANUFACTURING | | | LEGAL REGULATION C |

SYSTEM CONSTRUCTION EXAMPLE OF LCP SYSTEM

FIG.8A
FLOW OF IMPORTANCE LEVEL DECISION ASSISTANCE ON ENVIRONMENTAL ISSUES IN LIFE CYCLE (1)

START → INPUT INTO MATRIX OF LIFE CYCLE VS. ENVIRONMENTAL ISSUES (S21) → SET AIMED ELEMENTS (S22) → DATA INPUT FOR BENCH MARK PRODUCT & CONVENTIONAL PRODUCT (S23) → DISPLAY BENCH MARK COMPARISON (S24) → SET IMPORTANCE LEVELS INTO MATRIX (S25) → SET QUANTITATIVE TARGET VALUE (S26) → END

100: PRODUCT ENVIRONMENTAL INFORMATION DB

FIG.8B
FLOW OF IMPORTANCE LEVEL DECISION ASSISTANCE ON ENVIRONMENTAL ISSUES IN LIFE CYCLE (2)

START → INPUT INTO MATRIX OF LIFE CYCLE VS. ENVIRONMENTAL ISSUES (S21) → SET AIMED ELEMENTS (S22) → DATA INPUT FOR BENCH MARK PRODUCT & CONVENTIONAL PRODUCT (S23) → DISPLAY BENCH MARK COMPARISON (S24) → SET IMPORTANCE LEVELS INTO MATRIX (S25) → CORRECT IMPORTANCE LEVELS (S25') → SET QUANTITATIVE TARGET VALUE (S26) → END

100: PRODUCT ENVIRONMENTAL INFORMATION DB

→ :PROCESS FLOW
--→ :INFORMATION FLOW
▭ :PROCESS BY COMPUTER
▱ :PROCESS BY DESIGNER

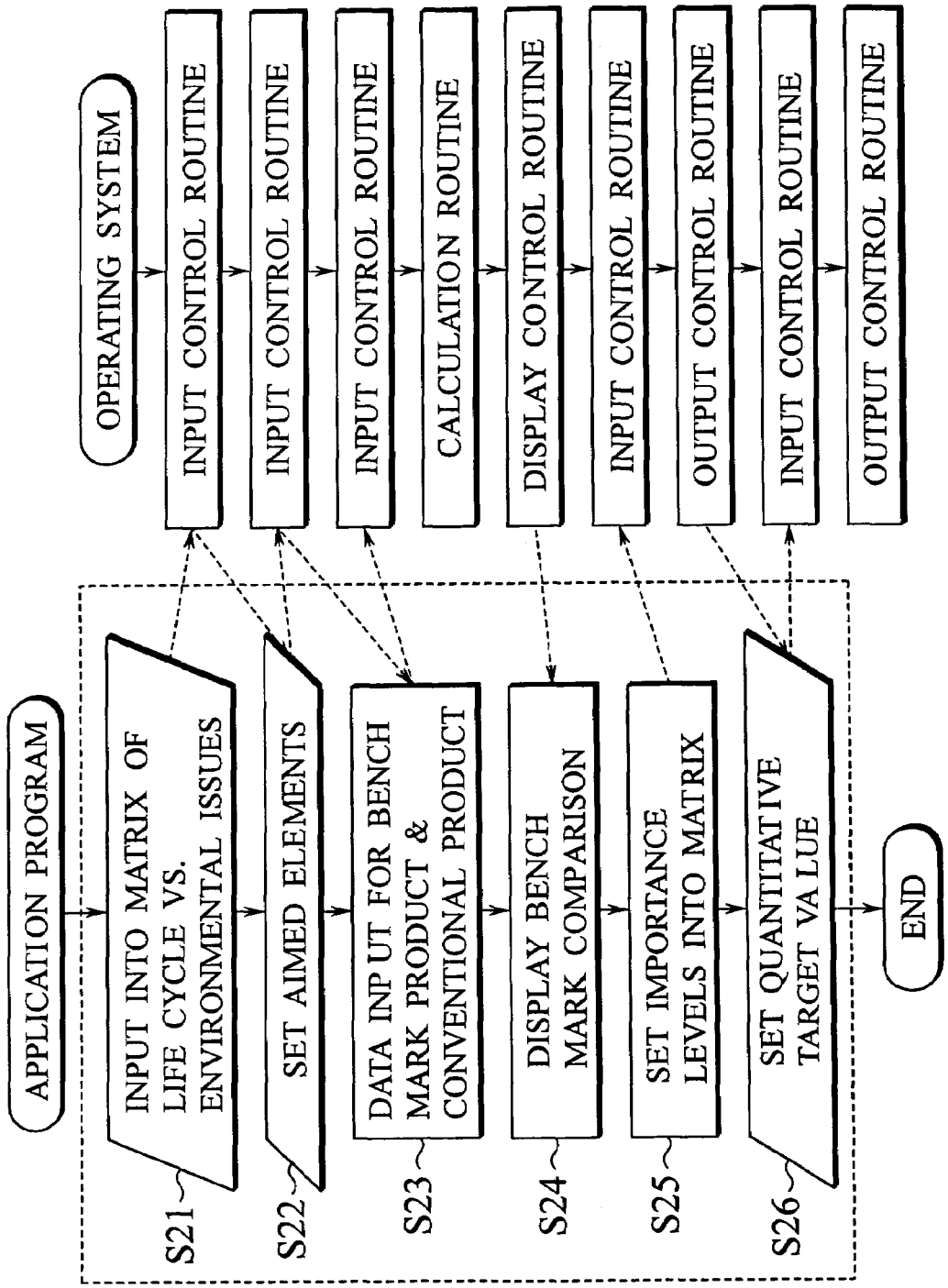
FIG.9 FLOW OF IMPORTANCE LEVEL DECISION ASSISTANCE ON ENVIRONMENTAL ISSUES IN LIFE CYCLE & OS

FLOW OF IMPORTANCE LEVELS DECISION ASSISTANCE ON EOL ISSUE IN LIFE CYCLE

CONCEPTUAL VIEW OF AIMED
EOL ISSUE ITEM DECISION (1)

CONCEPTUAL VIEW OF AIMED
EOL ISSUE ITEM DECISION (2)

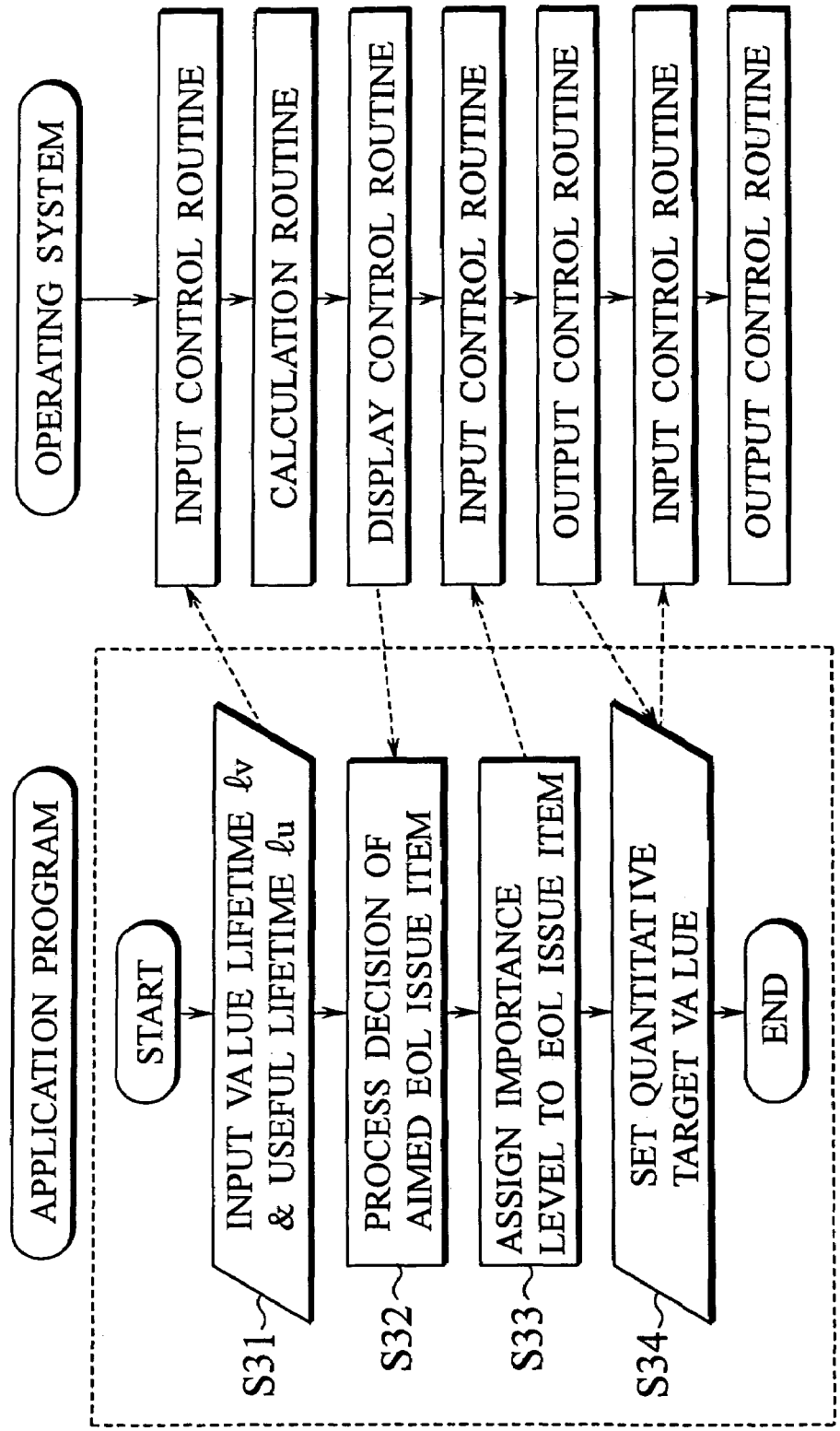
FIG.16 FLOW OF IMPORTANCE LEVELS DECISION ASSISTANCE ON EOL ISSUE IN LIFE CYCLE & OS

FIG.17

EXAMPLE OF ENVIRONMENTAL STRATEGY CONTENTS (ISSUES & IMPORTANCE LEVELS)

| ENVIRONMENTAL ISSUES IN LC PROCESS | IMPORTANCE LEVEL |
|---|---|
| RESOURCE SAVING/ DISPOSITION PHASE | 0.21 |
| ENERGY SAVING/ USE PHASE | 0.13 |
| WASTE REDUCTION/ DISTRIBUTION PHASE | 0.14 |
| HARMFULNESS REDUCTION/ MATERIAL SUPPLY PHASE | 0.15 |
| REDUCTION OF ENVIRONMENTAL IMPACTS /DISPOSITION PHASE | 0.37 |
| (OZONE LAYER PROTECTION/ DISPOSITION PHASE | 0.37 |
| WARNING PREVENTION/ DISPOSITION PHASE | 0.00 |
| OTHERS | 0.00 |
| TOTAL | 1.00 |

| EOL ISSUE | IMPORTANCE LEVEL |
|---|---|
| UPGRADING | 0.00 |
| PARTS REUSE | 0.00 |
| MAINTENANCE | 0.60 |
| MATERIAL RECYCLING | 0.40 |
| TOTAL | 1.00 |

FIG.19

EXAMPLE OF DB CONTENTS
(ENVIRONMENTAL ISSUES VS. DESIGN GUIDELINES)

| NUMBER | DESIGN GUIDELINE | ENVIRONMENTAL ISSUE ||||||
|---|---|---|---|---|---|---|
| | | RESOURCE SAVING | ENERGY SAVING | WASTE REDUCTION | HARMFULNESS REDUCTION | ENVIRONMENTAL IMPACT |
| 1 | MINIMUM USE OF NON-RECYCLABLE SCARCE MATERIAL | 2 | 1 | 3 | 1 | 0 |
| 2 | MAXIMUM USE OF RECYCLABLE MATERIAL | 3 | 2 | 5 | 1 | 0 |
| 3 | MAXIMUM USE OF RECYCLE MATERIAL | 1 | 0 | 1 | 0 | 0 |
| 4 | MINIMIZING CONSUMPTION OF MATERIAL PRODUCING ENERGY | 4 | 0 | 0 | 0 | 0 |
| 5 | MINIMIZING USE OF DANGEROUS SUBSTANCES | 2 | 2 | 0 | 1 | 0 |
| 6 | MINIMIZING AMOUNT OF MATERIAL USED | 1 | 1 | 1 | 1 | 0 |
| 7 | MINIMIZING KIND OF MATERIAL | 1 | 0 | 1 | 0 | 1 |
| 8 | MINIMUM USE OF NON-REPLACEABLE MATERIAL | 1 | 0 | 0 | 0 | 0 |
| 9 | MINIMIZING NUMBER OF MATERIAL COLORS | 4 | 0 | 0 | 0 | 1 |

FIG.20

EXAMPLE OF DB CONTENTS
(LIFE CYCLE PROCESS VS. DESIGN GUIDELINES)

| NUMBER | DESIGN GUIDELINE | LIFE CYCLE PROCESS ||||||
|---|---|---|---|---|---|---|
| | | MATERIAL ACQUISITION | MANUFACTURE | DISTRIBUTION | USE | DISPOSAL |
| 1 | MINIMUM USE OF NON-RECYCLABLE SCARCE MATERIAL | 1 | 0 | 0 | 0 | 1 |
| 2 | MAXIMUM USE OF RECYCLABLE MATERIAL | 1 | 1 | 0 | 0 | 1 |
| 3 | MAXIMUM USE OF RECYCLE MATERIAL | 1 | 1 | 0 | 0 | 0 |
| 4 | MINIMIZING CONSUMPTION OF MATERIAL PRODUCING ENERGY | 1 | 0 | 0 | 0 | 0 |
| 5 | MINIMIZING USE OF DANGEROUS SUBSTANCES | 1 | 1 | 1 | 1 | 1 |
| 6 | MINIMIZING AMOUNT OF MATERIAL USED | 1 | 1 | 0 | 1 | 0 |
| 7 | MINIMIZING KIND OF MATERIAL | 1 | 1 | 0 | 0 | 1 |
| 8 | MINIMUM USE OF NON-REPLACEABLE MATERIAL | 1 | 0 | 0 | 0 | 0 |
| 9 | MINIMIZING NUMBER OF MATERIAL COLORS | 1 | 0 | 0 | 1 | 0 |
| 10 | USING MATERIAL EASY TO SELECT AND SEPARATE | 1 | 0 | 0 | 1 | 1 |
| 11 | MINIMIZING STEP WASTE MATTER REGULATED PRESENTLY AND IN FUTURE | 1 | 1 | 0 | 0 | 1 |

FIG.21

EXAMPLE OF DB CONTENTS
(EOL ISSUE VS. DESIGN GUIDELINE)

| NUMBER | DESIGN GUIDELINE | EOL ISSUE ||||
| --- | --- | --- | --- | --- | --- |
| | | UPGRADING | MAINTENANCE | PARTS REUSE | MATERIAL RECYCLING |
| 1 | MINIMUM USE OF NON-RECYCLABLE SCARCE MATERIAL | 0 | 0 | 0 | 4 |
| 2 | MAXIMUM USE OF RECYCLABLE MATERIAL | 0 | 0 | 0 | 5 |
| 3 | MAXIMUM USE OF RECYCLE MATERIAL | 0 | 0 | 0 | 3 |
| 4 | MINIMIZING CONSUMPTION OF MATERIAL PRODUCING ENERGY | 0 | 0 | 0 | 0 |
| 5 | MINIMIZING USE OF DANGEROUS SUBSTANCES | 0 | 0 | 1 | 1 |
| 6 | MINIMIZING AMOUNT OF MATERIAL USED | 3 | 1 | 0 | 0 |
| 7 | MINIMIZING KIND OF MATERIAL | 0 | 2 | 0 | 1 |
| 8 | MINIMUM USE OF NON-REPLACEABLE MATERIAL | 4 | 1 | 2 | 0 |
| 9 | MINIMIZING NUMBER OF MATERIAL COLORS | 0 | 0 | 0 | 1 |
| 10 | USING MATERIAL EASY TO SELECT AND SEPARATE | 0 | 0 | 1 | 2 |
| 11 | MINIMIZING STEP WASTE MATTER REGULATED PRESENTLY AND IN FUTURE | 0 | 0 | 0 | 0 |

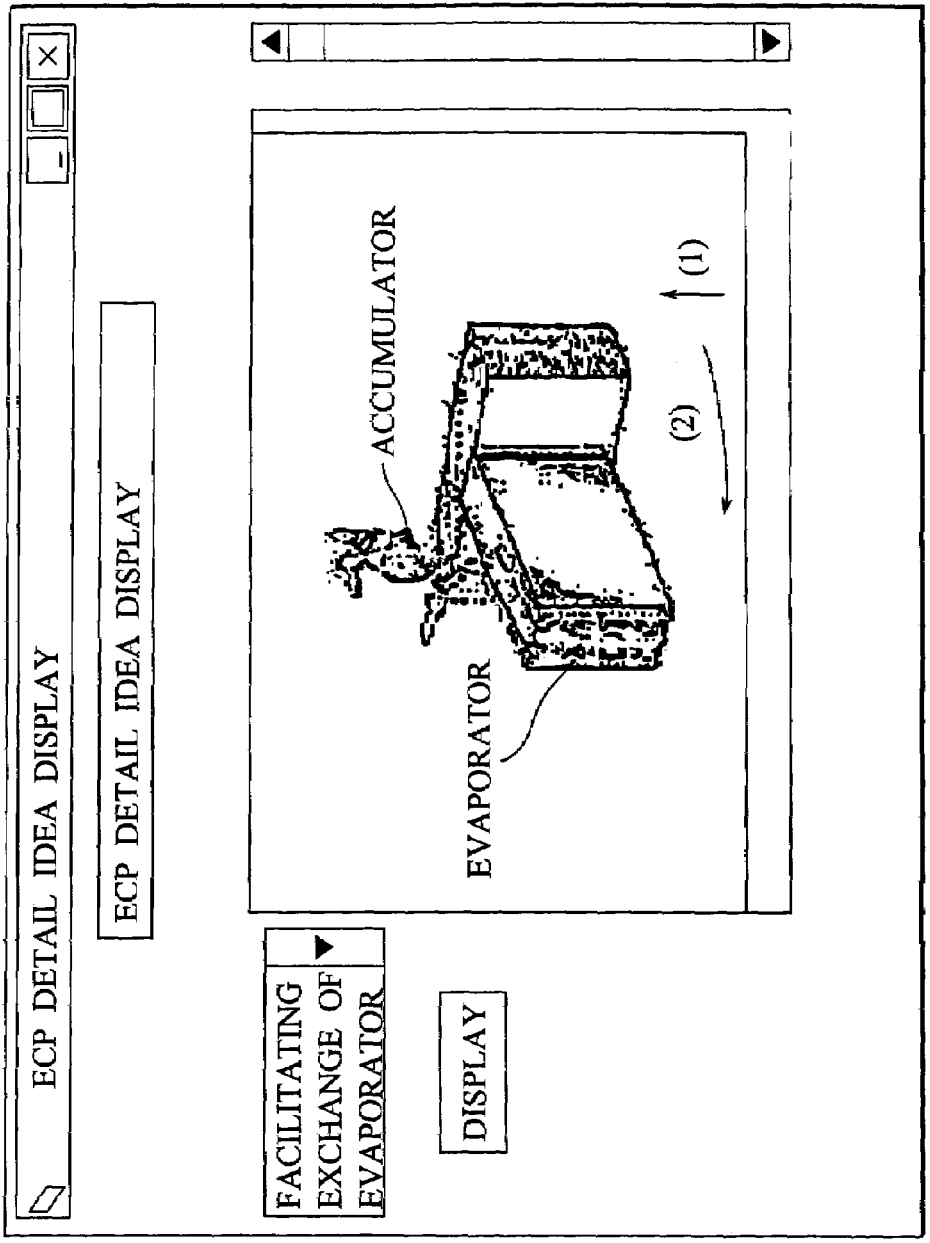

FIG.25 EMBEDDING INTO RELATIONSHIP MATRIX

◎ : ADAPTABLE & COST-PERFORMANCE UP
× : NON-ADAPTABLE

| PARTS CHARACTERISTICS | | | | | | | |
|---|---|---|---|---|---|---|---|
| ... | | | | | | | |
| WHITE COLOR RESIN CASING | 0.15 | | | | | × | |
| BLACK COLOR RESIN CASING | 0.15 | | | | | ◎ | |
| ... | | | | | | | |
| ... | | | | | | | |
| ADOPTING ESTER OIL | 0.2 | ◎ | | | | | |
| ADOPTING MINERAL OIL | 0.2 | × | | | | | |
| ... | | | | | | | |
| ... | | | | | | | |
| DISPOSING HEAT-RADIATING PANEL AT SIDE | 0.3 | | | × | | | |
| DISPOSING HEAT-RADIATING PANEL AT BOTTOM | 0.3 | | | ◎ | | | |
| ... | | | | | | | |
| ... | | | | | | | |
| IMPORTANCE | | | | | | | |

| LIFE CYCLE MATRIX ELEMENT | ECP DESIGN GUIDELINE DATA / ECP DESIGN GUIDELINE | ECP DETAIL IDEA DATA / ECP DETAIL IDEA | IMPORTANCE OF IDEA | | | | |
|---|---|---|---|---|---|---|---|
| LEGAL REGULATION | SELECTION OF ALTERNATE FLEON | REFRIGERANT :HFC134a | 0.4 | ... | ... | ... | ... |
| ... | ... | ... | | | | | |
| ... | ... | ... | | | | | |
| MAINTENANCE | IMPROVEMENT OF DISASSEMBLING EASE | CONCENTRATEDLY DISPOSING HEAT-RADIATING PANEL AT BOTTOM | 0.3 | ... | ... | ... | ... |
| ... | ... | ... | | | | | |
| MATERIAL RECYCLING | SELECTION OF RECYCLABLE MATERIAL | USE OF BLACK COLOR RESIN SUITABLE FOR RECYCLE | 0.2 | ... | ... | ... | ... |
| ... | ... | ... | | | | | |

EXAMPLE OF DECISION-MAKE ASSISTING SCREEN IMAGE (4)

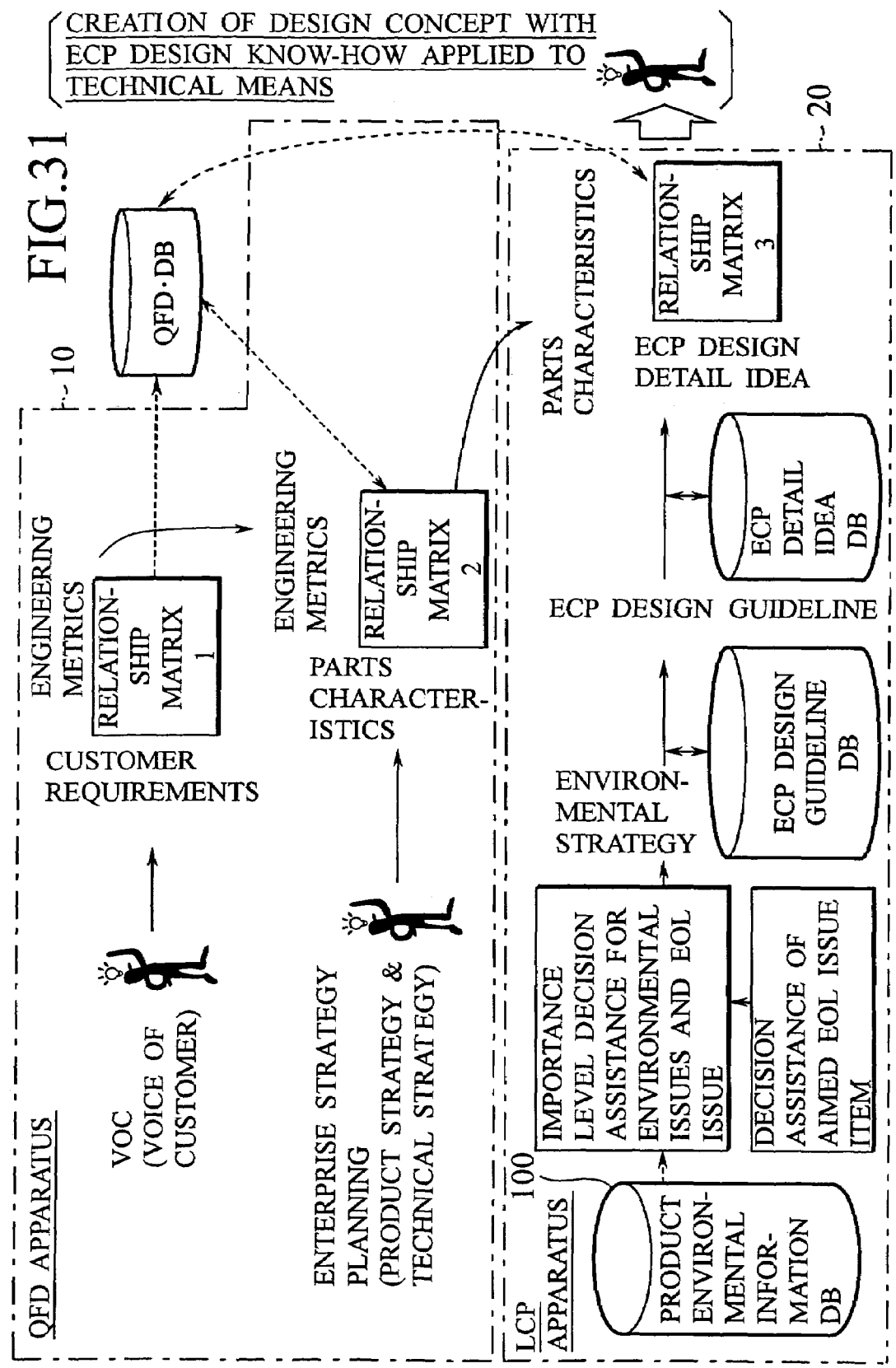

FIG.32

SETTING OF AIMED REGIONS

| | MATERIAL ACQUISITION | MANUFACTRUING | DISTRIBUTION | USE | DISPOSAL |
|---|---|---|---|---|---|
| RESOURCE SAVING | | LIFE EXTENDING | | | LEGAL REGULATION A |
| ENERGY SAVING | SUPPLY FREQUENCY | ENERGY SAVING PROCESS | | ELECTRICITY SAVING MODE IMPROVING | |
| WASTE REDUCTION | RECYCLABLE PLASTIC | | PACKING REDUCTION | | |
| HARMFULNESS REDUCTION | LEGAL REGULATION B | | | | |
| REDUCTION OF EVVIRONMENTAL IMPACT | | CLEAN MANUFACTURING | | | LEGAL REGULATION C |

FIG.33

PRODUCT ENVIRONMENTAL DATA OF BENCH MARK PRODUCT

| | MATERIAL ACQUISITION | MANUFACTURING | DISTRIBUTION | USE | DISPOSAL |
|---|---|---|---|---|---|
| NEW RESOURCE INPUT (kg) | 100 | 1000 | 5 | 0 | 80 |
| ENERGY INPUT (kWh) | 1300 | 40 | 40 | 6000 | 200 |
| AMOUNT OF WAST DISCHARGED (kg) | 2 | 5 | 4 | 0 | 7 |
| AMOUNT OF HARMFUL SUBSTANCE USED (kg) | 0.5 | 2 | 0 | 0 | 0 |
| OZONE LAYER DESTRUCTION (ODP*kg) | 0.9 | 2 | 0 | 0 | 0.3 |

FIG.34

PRODUCT ENVIRONMENTAL DATA OF SELF COMPANY CONVENTIONAL PRODUCT

| | MATERIAL ACQUISITION | MANUFACTURING | DISTRIBUTION | USE | DISPOSAL |
|---|---|---|---|---|---|
| NEW RESOURCE INPUT (kg) | 105 | 1500 | 7 | 0 | -90 |
| ENERGY INPUT (kWh) | 1200 | 50 | 50 | 4200 | 300 |
| AMOUNT OF WAST DISCHARGED (kg) | 3 | 8 | 3 | 0 | 10 |
| AMOUNT OF HARMFUL SUBSTANCE USED (kg) | 0.4 | 0.1 | 0 | 0 | 0 |
| OZONE LAYER DESTRUCTION (ODP*kg) | 1.2 | 3 | 0 | 0 | 0.6 |

FIG.35

BENCH MARK COMPARISON REGARDING AIMED REGIONS

| | MATERIAL ACQUISITION | MANUFACTURING | DISTRIBUTION | USE | DISPOSAL |
|---|---|---|---|---|---|
| RESOURCE SAVING | | | | | 1.13 |
| ENERGY SAVING | | | | 0.70 | |
| WASTE REDUCTION | | | 0.75 | | |
| HARMFULNESS REDUCTION | 0.80 | | | | 2.00 |
| REDUCTION OF ENVIRONMENTAL IMPACT | | | | | |

FIG.36A

SETTING OF IMPORTANCE LEVELS INTO MATRIX

|  | MATERIAL ACQUISITION | MANUFACTURING | DISTRIBUTION | USE | DISPOSAL |
|---|---|---|---|---|---|
| RESOURCE SAVING |  |  |  |  | 0.21 |
| ENERGY SAVING |  |  |  | 0.13 |  |
| WASTE REDUCTION |  |  | 0.14 |  |  |
| HARMFULNESS REDUCTION | 0.15 |  |  |  |  |
| REDUCTION OF ENVIRONMENTAL IMPACT |  |  |  |  | 0.37 |

FIG.36B

SETTING OF IMPORTANCE LEVELS INTO MATRIX

| | MATERIAL ACQUISITION | MANUFACTURING | DISTRIBUTION | USE | DISPOSAL |
|---|---|---|---|---|---|
| RESOURCE SAVING | | | | | 0.30 |
| ENERGY SAVING | | | | 0.13 | |
| WASTE REDUCTION | | | 0.14 | | |
| HARMFULNESS REDUCTION | 0.15 | | | | |
| REDUCTION OF ENVIRONMENTAL IMPACT | | | | | 0.28 |

FIG.37
ANOTHER EMBODIMENT
(LIFE CYCLE PROCESS VS. ENVIRONMENTAL ISSUES + EOL ISSUE)

| | | MATERIAL ACQUISITION | MANUFACTURING | DISTRIBUTION | USE | DISPOSAL |
|---|---|---|---|---|---|---|
| ENVIRONMENTAL ISSUE | RESOURCE SAVING | | LIFE EXTENDING | | | LEGAL REGULATION A |
| | ENERGY SAVING | SUPPLY FREQUENCY | ENERGY SAVING PROCESS | | ELECTRICITY SAVING MODE IMPROVING | |
| | WASTE REDUCTION | RECYCLABLE PLASTIC | | PACKING REDUCTION | | |
| | HARMFULNESS REDUCTION | LEGAL REGULATION B | | | | |
| | REDUCTION OF ENVIRONMENTAL IMPACT | | CLEAN MANUFACTURE | | | LEGAL REGULATION C |

| EOL ISSUE | | | |
|---|---|---|---|
| UPGRADING | | | |
| MAINTENANCE | | ▨ | ▨ |
| PARTS REUSE | | | |
| MATERIAL RECYCLING | | ▨ | ▨ |

COMPUTER-AIDED DESIGNING ASSISTANT APPARATUS AND METHOD OF ASSISTING DESIGNING OF ENVIRONMENTALLY CONSCIOUS PRODUCT

This application is based upon and claims the benefit of priority under 35 U.S.C. § 120 from U.S. Ser. No. 09/321,545, filed on May 28, 1999, and under 35 U.S.C. § 119 from Japanese Patent Application No. 11-026581, filed February 3, 1999, the entire contents of each of which are incorporated herein by reference.

BACKGROUND OF THE INVENTION

1. Field of the Invention

The present invention relates to a computer-aided product designing assistant device and a product designing assistant method for assisting designing of an industrial product and its life cycle, such that the environmental load which is put on the environment due to the product through the entire product life cycle including acquisition of materials of the product, manufacturing of the product, usage of the manufactured product and disposal of the product that has been used up, is reduced to a level lower than those of conventional products.

2. Related Art

With the developments of industry and economy, a fear has come to arise that the earth will get warmed-up due to the green house effect which results from an increasing amount of discharged gases. On the other hand, there also have arisen various problems such as the destruction of nature resulting from throwing-away of a huge amount of disuse rubbish and trashes, the environmental pollution resulting from harmful materials and substances contained therein, etc. From these points of view, the mitigation of the environmental load on the earth has been becoming an important task in the field of industry.

In a case where considering the environmental load in relation to the industry of manufacture, it is insufficient to set a sight on a range that merely covers the acquisition of materials of a product, the manufacturing thereof and the forwarding of the manufactured product. In such a case, it is also necessary to take the environmental load given during the process including the disposal stage and the recycling stage into consideration. In addition, in the case of a product which is followed by the consumption of energy when put to practical use, such as home electric appliances, automobiles and the like, it is necessary that consideration is given also to the consumption of energy during the process in which a product that has been handed to a user is utilized.

On this account, a designing assistant technique that a stress is placed upon the process of life cycle becomes more and more important from now onward, so as to certainly reduce the environmental load due to the designed and manufactured product in the entire product life cycle covering from the acquisition of materials to the disposal phases to a level lower than in the case of a conventional product.

Meanwhile, considering the conventional designing assistant technique, there are the following inconveniences (1) to (3) for designing ECP (Environmental Conscious Products) and planning a life cycle process thereof.

(1) The conventional designing assistant technique inconveniently permits a person who performs designing to enter upon his designing of a concrete structure according solely to his personal way of thinking, while the designing issues and the concept associated with the environmental factors that are the most important for each product to be designed are left unclear. Therefore, it is unavoidable in such designing to possibly reach his design solution that is not very effective, from the synthetic and overall point of view, for the reduction of the environmental load.

The reason for this is because, although it is naturally preferred to find a satisfactory solution to each of the designing issues concerning the environment (the energy saving, the recycle capability enhancement, etc.), such a designing solution that can give an optimum value to all the designing issues associated with the environment does not commonly exist. Accordingly, in actual product designing, it is necessary to provide a designing concept such that, from the synthetic point of view, a sight is concentratedly focused on the most important issues for the product to be designed so as to effectively design an environmentally conscious product.

(2) Since the concept regarding the environment is not clear, the efficiency of designing is sometimes decreased by using an environmental evaluation apparatus that will not be useful in truth with regard to the aimed product, or by spending a large amount of time in evaluation whose results only has low importance, etc.

(3) Also when determining a design solution among a plurality of design candidates produced by trial designing, it is still unclear which designing issue associated with the environment is important to what extent. Therefore, it sometimes happens to inconveniently select such a design that is not very effective for the decrease in the environmental load as a design solution.

Accordingly, it has been highly expected to develop a sure and highly reliable designing assistant technique for enabling the development of a product of new design so as to certainly reduce the environmental load of the designed product through the entire product life cycle covering from the acquisition of materials thereof to the disposal of the used-up product to a lower level than in the case of a conventional product.

SUMMARY OF THE INVENTION

An object of the present invention is to provide a computer-aided product designing assistant device and a product designing assistant method for assisting real designing of ECPs (Environmentally Conscious Products) accompanied with creation orestablishment of a designing concept in relation to the product life cycle thereof, in which the environmental load put on the environment due to the designed product through its entire product life cycle covering from the acquisition of materials thereof to the disposal thereof is reduced to a lower level than those of the conventional products.

According to one aspect of the present invention, the foregoing object is accomplished by providing a computer-aided product designing assistant apparatus for assisting designing of an environmentally conscious product by presenting at least one design guideline to be adopted in designing the environmentally counscious product, the apparatus comprising: a database storing a plurality of design guidelines for each product and evaluation values assigned to each design guideline in relation to a plurality of environmental issues and a plurality of phases defining a life cycle of products, the evaluation values assigned to each design guideline being capable of indicating an effectiveness of each design guideline in resolving each environmental issue at each phase of the life cycle, each environmental issue respectively representing an issue to be resolved in order to reduce environmental load due to each product; and a processing unit for determining a relative importance level of each environmental issue at each phase of the life cycle for a product to be designed, selecting at least one design guideline for the product to be designed from said plurality of design guidelines stored in the database according to the evaluation values stored in the database and the relative importance level of each environmental issue at each phase of the life cycle determined for the product to be designed, and presenting said at least one design guideline selected for the product to be designed.

According to another aspect of the present invention, the foregoing object is accomplished by providing a computer-aided product designing system for designing an environmentally conscious product, comprising: an assistant apparatus for assisting designing of the environmentally conscious product by presenting at least one design guideline to be adopted in designing the environmental counscious product, the assistant apparatus having: a database storing a plurality of design guidelines for each product and evaluation values assigned to each design guideline in relation to a plurality of environmental issues and a plurality of phases defining a life cycle of products, the evaluation values assigned to each design guideline being capable of indicating an effectiveness of each design guideline in resolving each environmental issue at each phase of the life cycle, each environmental issue representing an issue to be resolved in order to reduce environmental load due to each product; and a processing unit for determining a relative importance level of each environmental issue at each phase of the life cycle for a product to be designed, selecting at least one design guideline for the product to be designed from said plurality of design guidelines stored in the database according to the evaluation values stored in the database and the relative importance level of each environmental issue at each phase of the life cycle determined for the product to be designed, and presenting said at least one design guideline selected for the product to be designed.

According to a third aspect of the present invention, the foregoing object is accomplished by providing a product designing assistant method for assisting designing of an environmentally conscious product by presenting at least one design guideline to be adopted in designing the environmental counscious product, the method comprising the steps of: preparing a database storing a plurality of design guidelines for each product and evaluation values assigned to each design guideline in relation to a plurality of environmental issues and a plurality of phases defining a life cycle of products, the evaluation values assigned to each design guideline being capable of indicating an effectiveness of each design guideline in resolving each environmental issue at each phase of the life cycle, each environmental issue representing an issue to be resolved in order to reduce environmental load due to each product; determining a relative importance level of each environmental issue at each phase of the life cycle for a product to be designed; selecting at least one design guideline for the product to be designed from said plurality of design guidelines stored in the database according to the evaluation values stored in the database and the relative importance level of each environmental issue at each phase of the life cycle determined for the product to be designed; and presenting said at least one design guideline selected for the product to be designed.

According to a fourth aspect of the present invention, the foregoing object is accomplished by providing a computer usable medium having computer readable program code means embodied therein for causing a computer to function as a product designing assistant apparatus for assisting designing of an environmentally conscious product by presenting at least one design guideline to be adopted in designing the environmentally counscious product, with a database storing a plurality of design guidelines for each product and evaluation values assigned to each design guideline in relation to a plurality of environmental issues and a plurality of phases defining a life cycle of products, the evaluation values assigned to each design guideline being capable of indicating an effectiveness of each design guideline in resolving each environmental issue at each phase of the life cycle, each environmental issue respectively representing an issue to be resolved in order to reduce environmental load due to each product, the computer readable program code means includes: first computer readable program code means for causing said computer to determin a relative importance level of each environmental issue at each phase of the life cycle for a product to be designed, second computer readable program code means for causing said computer to select at least one design guideline for the product to be designed from said plurality of design guidelines stored in the database according to the evaluation values stored in the database and the relative importance level of each environmental issue at each phase of the life cycle determined for the product to be designed, and third computer readable program code means for causing said computer to present said at least one design guideline selected for the product to be designed.

BRIEF DESCRIPTION OF THE DRAWINGS

The features and advantages of the product designing assistant apparatus and method and the product designing system and the computer usable medium according to the present invention over the conventional arts will be more clearly understood from the following description of the preferred embodiments of the present invention taken in conjunction with the accompanying drawings in which like reference numerals designate the same or similar elements or sections throughout the figures thereof and in which:

FIG. 3 is a block diagram illustrating a hardware construction in a case where the designing system of the present invention is realized using a general-purpose computer;

FIG. 4 is a view taken for explanation of the operation in the present invention, which illustrates the relationship between the designing process and the systemizing units of the designing system of the present invention;

FIG. 5 is a view taken for explanation of the processing in the present invention, which illustrates an example of the contents of a matrix defined by the phases of life cycle and the environmental issues used in the designing assistance of the present invention;

FIGS. 8A and 8B are views taken for explanation of the present invention, each of which is a flowchart respectively illustrating the flow of a importance level decision assistant processing on the environmental issues at the phases of the life cycle process, used in the designing assistance of the present invention;

FIG. 9 is a view taken for explanation of the present invention, which is a flowchart illustrating the flow of a Importance level decision assistant processing on the environmental issues at the phases of the life cycle and the operating system, used in the designing assistance of the present invention;

FIG. 16 is a view taken for explaining the present Invention, which illustrates the operational cooperation relationship between an application program and an operating system (OS) that are used in an importance level determination processing for the aimed EOL issue items, used in the designing assistance of the present invention;

FIG. 17 is a view taken for explanation of the present invention, which illustrates an example of the importance levels (=environmental strategy) on the environment-associated designing issues regarding an object product (refrigerator), described for the present invention;

FIG. 19 is a view taken for explaining the present invention, which illustrates an example of the contents associated with environmental issues versus design guidelines in a design guideline database used in the designing assistance of the present invention;

FIG. 20 is a view taken for explaining the present invention, which illustrates an example of the contents associated with the life cycle process versus design guidelines in the design guideline database used in the designing assistance of the present invention;

FIG. 21 is a view taken for explaining the present invention, which illustrates an example of the contents associated with the EOL issue versus design guidelines in the design guideline database used in the designing assistance of the present invention;

FIG. 24 is a view taken for explaining the present invention, which illustrates an example of displaying the ECP design know-how used in the designing assistance of the present invention;

FIG. 25 is a view taken for explaining the present invention, which illustrates an example of performing embedding into a correlation matrix used in the designing assistance of the present invention;

FIG. 31 is a system conceptual view illustrating another embodiment of the designing assistant system according to the present invention;

FIG. 32 is a view taken for explaining the present invention, which illustrates an example of the contents of setting aimed elements of the matrix defined by the phases of the life cycle process and the environmental issues, used in the designing assistance of the present invention;

FIG. 33 is a view taken for explaining the present invention, which illustrates an example of the contents of product environmental data set in the matrix defined by the phases of the life cycle process and the environmental issues for a bench mark product, used in the designing assistance of the present invention;

FIG. 34 is a view taken for explaining the present invention, which illustrates an example of the contents of the product environmental data set in the matrix defined by the phases of the life cycle process and the environmental issues for a conventional product of the self company, used in the designing assistance of the present invention;

FIG. 35 is a view taken for explaining the present invention, which illustrates an example of the bench mark comparison regarding the aimed elements in the matrix of the life cycle process versus environmental issues, used in the designing assistance of the present invention;

FIGS. 36A and 36B are views taken for explaining the present invention, each of which illustrates respectively an example of the importance level embedding in the matrix of the life cycle process versus environmental issues, used in the designing assistance of the present invention;

FIG. 37 is a view taken for explaining the present invention, which illustrates an example of the matrix of the life cycle process versus environmental issues+EOL issue according to another embodiment of the present Invention.

DETAILED DESCRIPTION OF THE PREFERRED EMBODIMENTS

Figure 1:
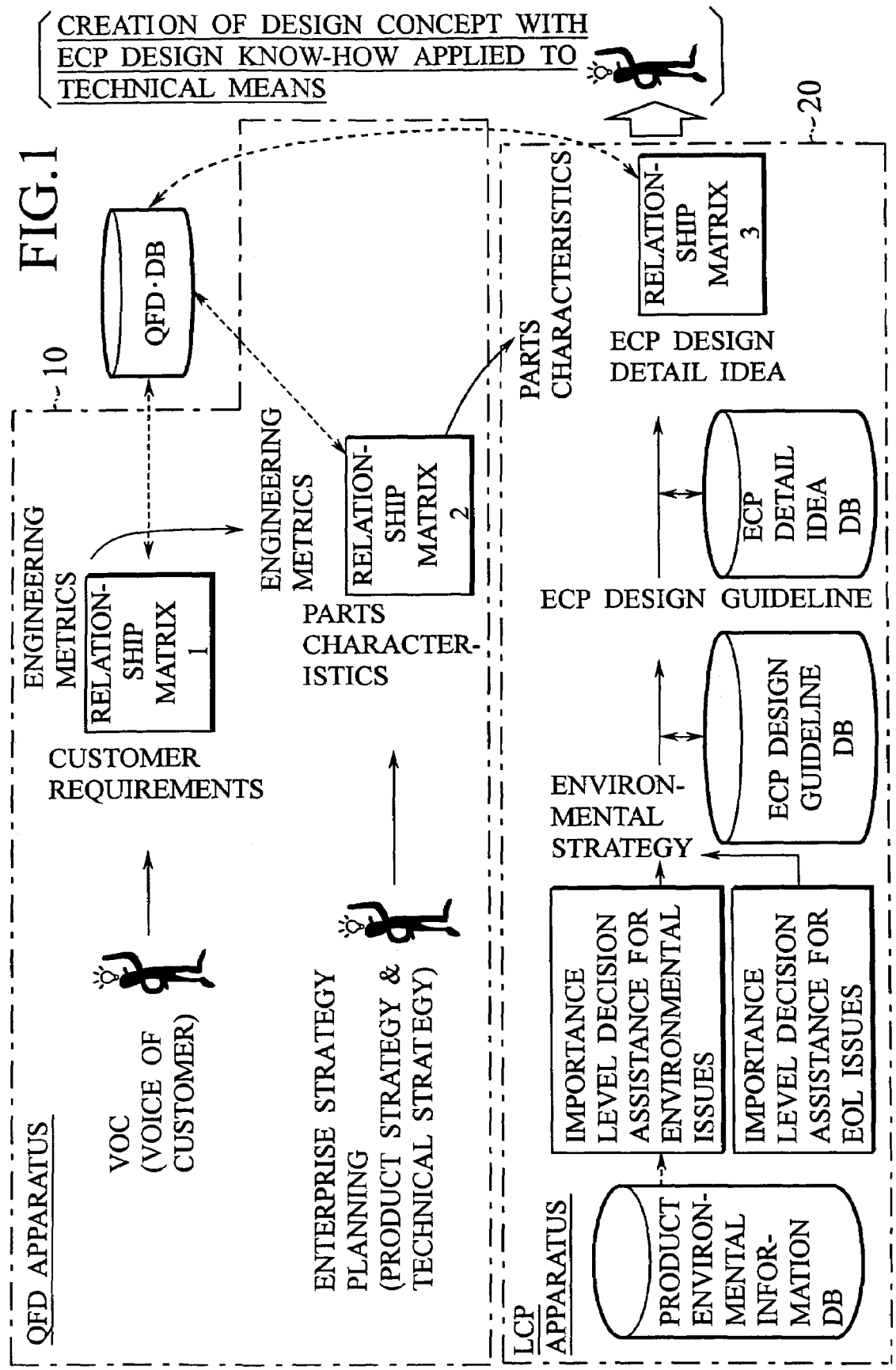
FIG. 1 is a view for illustrating a system concept of an embodiment of a computer-aided product designing assistant device according to the present invention.

In designing an industrial product, the designer selects some appropriate design guidelines among many design guidelines, i.e., detailed designing items in relation to the details of the product in order to reflect his designing strategy to the designed product, and the selected design guidelines are then adopted in real designing, with use of a designing apparatus such as a CAD (Computer-Aided Designing) apparatus or the like, for completing the design of product. The design guidelines include, for example, material selection on composing of the product, shapes of the product, mechanical requirements such as strength and durability under various kinds of force and the like.

The design strategy in the conventional design can be classified into market strategy and enterprise strategy. The market strategy is a designing direction as to which is selected of the designing issues that the user is requesting to resolve in relation to improvement of product qualities or functions, price reduction and the like, to give priority for resolution. The enterprise strategy is one as to which is selected of the designing issues that resolution is required at the product supply side on account of holding the business well, such as the technique and cost of manufacturing, distribution cost and the like, to give priority. These types of strategy are possibly reflected to the product designing by using the GFD (Quality Function Deployment) technique (ref. Don Clausing, "Total Quality Development", 1993, ASME, New York).

On the other hand, environmental strategy for realizing designing of environmentally conscious products is a designing direction as to which of the designing issues that resolution is required for reducing the environmental load given to the environment due to the product (e.g. pollution and destruction of the environment and living matters, exhausting of natural resources, etc.) Is selected to give priority. The environmental strategy is rather different from the market strategy and the enterprise strategy and it is quite difficult to reflect the environmental strategy to the product design in the conventional manner as it is expected. Namely, even if designing of an environmentally conscious product is made using the QFD method, the obtained design is pretty insufficient. The reason for this seems that the design guidelines are complicatedly concerning with a plurality of environmental issues, and that it is extremely difficult to find the most effective design guideline for the specific product. Accordingly, for designing of environmentally conscious products, the environmental issues should be considered in total to select a design guideline to be given the priority, apart from the market and enterprise strategies.

According to the above, the present invention suggests a computer-aided product designing assistant apparatus and a product designing assistant method, which realizes synthetic consideration of the environmental issues on product designing to present a design guideline which is considered as the best for adopting in designing the environmentally conscious product. If the designing assistant apparatus of the present invention is used in combination with the QFD technique, it is possible to design a product to which all of the market strategy, the enterprise strategy and the environmental strategy are reflected.

The environmental load due to industrial products can be generally classified into five items, specifically, 1) exhaust of natural resource, 2) energy consumption, 3) increase of waste materials, 4) pollution by harmful matters, and 5) deterioration in the earth environment. In accordance with the above, the environmental issues can also be classified into five types, i.e., 1) resource saving, 2) energy saving, 3) waste reduction, 4) harmfulness (use of harmful substance) reduction, and 5) reduction of environmental impacts. Each of these environmental issues can be further divided into detailed items according to the phases of life cycle of products, i.e., 1) a material aquisition phase. 2) a product manufacturing phase, 3) a product distribution phase, 4) a product use phase, and 5) a product disposal phase, and these detailed items of the environmental issues are useful items for easily fixing the environmental strategy and processing the data. However, there are another type of items in the issue relating to recycle and reuse of disused products at the EOL (End Of the Life) stage of products. The items of this issue (EOL issue) cannot be sufficiently considered in the same manner that the items of the environmental issues are processed, due to particularity of the EOL issue. Therefore, in the product designing assistance of the present invention, the items of the EOL issue are processed separately from the items of the environmental issues.

An embodiment of the present invention will now be explained. The present invention provides a method and an apparatus for assisting to form an ECP (environmentally conscious Product) in which the load put on the environment during its entire life cycle is small and make a concept of a life cycle process thereof (hereafter formation of both an ECP itself and a concept for its life cycle process is called formation of "a design concept") and for assisting the actual designing of a product. An explanation thereof will be given below with reference to the drawings.

FIG. 1 is a view showing a system conception of a computer-aided product designing assistant system of the present invention. As illustrated in FIG. 1, this system according to the present invention comprises, as main parts, a quality function deployment apparatus 10 (which is hereinafter referred to as "a QFD apparatus") for obtaining suitable data. (parts characteristics data) regarding technical realizing means, which has been made clear with the quality function deployment (QFD: Quality Function Deployment) technique for realizing in an optimum balance the designing issues associated with the performance and cost of a product, and a computer-aided life cycle planning apparatus (hereinafter referred to as an LCP apparatus, LCP: Life Cycle Planning) 20, which is a designing assistant apparatus that is used at the stage of planning and the stage of concept making in the process of designing.

The LCP apparatus 20 is a designing assistant apparatus that is used at the stage of planning and the stage of concept designing in the process of designing, and an assistant apparatus of this kind has not hitherto existed. In this LCP apparatus 20, the "importance levels of the environmental issues to be aimed at" (=environmental strategy) are calculated in consideration of the properties of a product to be designed, and assistance is made on the formation of an environmentally conscious product and a concept for the life cycle process of that product on the basis of those importance levels.

At this time, it is possible to make matching with the data (parts characteristics data) regarding technical realizing means, which is made clear with a quality function deployment (QFD) technique for realizing in an optimum balance the resolutions of the designing issues associated with the performance and cost of a product. This makes it possible to design a product that is optimum In terms of the harmonization with the environment as well as in terms of the performance and cost.

Moreover, by using this LCP apparatus, it is possible to consider in a balanced state a plurality of designing issues associated with the environment at the early stage of designing process from the synthetic and holisticl point of view.

Specifically, technical issues are processed in the QFD apparatus 10 with the use of the QFD technique made therefor to realize the designing issues in an optimum balance. For example, the QFD apparatus 10 performs processing of the technical issues associated with the product performance and product cost with the use of the quality function deployment technique to thereby obtain an optimum design specification. The QFD apparatus 10 executes: the quality requirement deployment for realizing in an optimum balance with the use of the QFD technique the designing issues based on users' requests or feelings (what is called "the voices of the customer") such as foodstuff preservation level, handling ease in use, space-saving capability, safety level and the like; and the engineering metrics for realizing in an optimum balance with the use of the QFD technique the designing issues such as various conditions for designing standards which are intended to be applied to the product such as outer dimensions, cooling ability and the like, thereby obtaining a first relationship matrix in which it is determined how these deployments should be reflected. The QFD apparatus 10 also executes the parts characteristics deployment for realizing in an optimum balance with the use of the QFD technique the designing issues based on the use of enterprise strategy planning (product strategy and technical strategy) such as HFC heat-insulating technique and the like, thereby obtaining a second QFD relationship in which it is determined how this parts characteristics and said engineering metrics should be reflected.

Moreover, the LCP apparatus 20 is equipped with a database for product environmental information, a database for ECP design guideline, and a database for ECP detail idea. The LCP apparatus 20 is also equipped with a functional element for assisting the decision of an importance level (degree of importance) on each of the environmental issue items and a functional element for assisting the decision of an importance level on each of the EOL issue items, thereby determining the environmental strategy and, according to this environmental strategy, deploying the ECP design guidelines. The LCP apparatus 20 is further capable of executing the ECP detail idea deployment, thereby obtaining a final and clarified design concept from the third relationship matrix.

Here in this apparatus, a matrix that is defined by the respective phases of the product life cycle and the respective environmental issues with the columns and rows is used to determine some elements of the matrix as aimed or focussing elements. Then the environmental data of an existing product for the product to be designed is embedded into this matrix, and comparison is made between the matrixes of two existing products associated with data items. Using this relative comparison result, the importance levels are allotted to each of the aimed regions.

In this LCP apparatus 20, the "elements (designing issues at specific phases) to be most essentially aimed at and the importance levels (=environmental strategy) as estimated with respect thereto" are determined with calculation, in consideration of the property of the product to be designed, and assists the formation of an environmentally conscious product and a concept of a product life cycle process on the basis of those importance levels.

It is to be noted that the product environmental information database is one in which design evaluation results and material-constituting data of many existing products are collected as a database. As the stored data, there are, for example, "the amount of consumption of the resources", "the amount of consumption of the energy", "the degree of destruction of the ozone layer", "material-constituting date", etc.

The ECP design guideline database is one which holds data regarding the "design guidelines" and "environmental issues". As the design guidelines, there are collected, as a database, data items that include, for example, "the minimum use of scarce materials unavailable for constant recycling", "the maximum use of materials capable of recycle", "the maximum use of recyclable material", "minimizing the consumption of energy for production of materials", "minimizing the use of dangerous substances", "minimizing the amount of use of materials", "minimizing the kinds of materials", "minimum use of non-replaceable materials", "minimizing the number of colors of materials", etc. Moreover, as the environmental issues, there are collected, as a database, data items that include "resources saving", "energy saving", "reduction of waste matters", "reduction of harmful substances" and "reduction of influence on the earth environment". As the phases of the product life cycle process, there are "materials acquisition", "manufacturing", "distribution", "usage", "disposal", and as the EOL issues, there are "upgrading", "maintenance", "parts reuse", "material recycling", etc.

Moreover, the ECP detail idea database (environmentally conscious product detail idea database) is one in which various designing examples that have hitherto been accumulated on the side of a system user who develops products by the use of the present system have been collected as figures or texts, and which enables to refer to or use the past designing cases when developing his products.

<Construction Example of the Designing Apparatus for Environmentally Conscious Designing>

Figure 2:
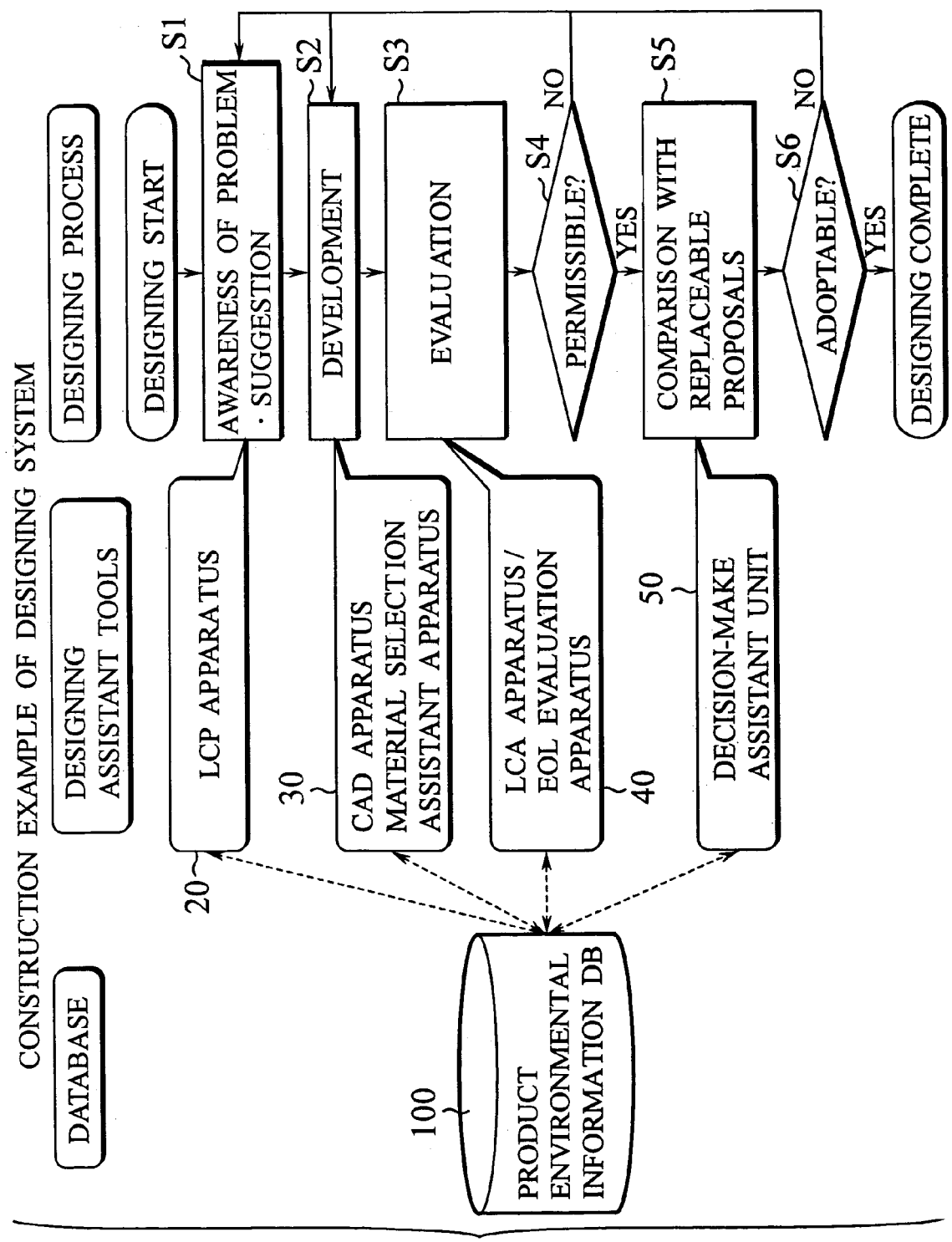
FIG. 2 is a construction example of a computer-aided designing system according to the present invention for use in designing of environmentally conscious products.

FIG. 2 illustrates a construction example of the designing system of the present invention for performing an environmentally conscious designing.

As illustrated in FIG. 2, the construction of this system comprises respective functional elements that comprises a database unit and respective designing assistant tools. As the database unit there is a product environmental information database 100 having product environmental data stored therein and, as the designing assistant tools, there are a LCP apparatus 20 for life cycle planning assistance, a deployment assistant unit 30 such as a CAD apparatus, material selection assistant apparatus, etc., an evaluation assistant unit 40 such as an LCA (Life Cycle Assessment) apparatus, an EOL (End Of Life) evaluation apparatus, etc., and a decision-make assistant unit 50 for assisting to make a decision for a final design output.

These designing assistant tools serve to perform life cycle planning assistance, deployment assistance, evaluation assistance and decision-make assistance and, when executing these steps of assistance, these tools can refer to the database of the product environmental information database 100 and reflect the results on the database thereof.

And the designing process comprises the steps of: awareness of problem and proposal items suggestion using the life cycle planning assistant apparatus 20 (S1); processing to deploy these presented issues and proposals using the development assistant unit 30 such as a CAD apparatus or material selection assistant apparatus (S2); evaluating the development-processed results using the evaluation assistant unit 40 such as an LCA apparatus or EOL evaluation apparatus (S3); determining whether the evaluation results fall within a permissible range (S4); and, if they are out of the permissible range, returning the flow to the corresponding processing in the steps S1 and S2 according to the contents of such evaluation results. Then, this processing is executed again after the factors and conditions involved have been coordinated, and evaluation is made again by using the evaluation assistant unit 40 (S3), and it is determined whether the evaluation results fall within the permissible range (S4).

After the determination made in step S4 where it is again determined whether the evaluation results fall within the permissible range, the designing process further comprises the steps of: if they fall within the permissible range, comparing the evaluation results with alternate proposals (S5) by the use of the decision-make assistant unit 50 for assisting a decision-making, thereby determining whether adopting the present product design output (S6) or not: and if "NO" determination is made, returning the flow to the processing in step S1 and S2. Then, this processing is executed after the factors and conditions have been coordinated and evaluation is made again using the evaluation assistant unit 40 (S3). Then, it is determined whether the evaluation results fall within the permissible range (S4).

As a result of the judgement made in step S6, if the present product design is adoptable, the process is ended and the present product design is to be adopted.

Using the designing system in this way along the designer's issue-settling cycle, it is possible to efficiently design a product in which harmonization with the environment is excellent, with the use of a method that is most suitable for a target product, that is an original object.

The unit (evaluation unit) that executes various evaluations and analyses becomes usable only when the quantitative model of an evaluation object (the product and product life cycle process) has been produced. Conventionally, a designer directly devised a product model becoming an evaluation object relying solely upon his own ability, and produced it on the CAD apparatus as a structural model and used it. At this stage, the designer must have determined a part of the product life cycle process regardless of whether he is aware of this. Because the product life cycle process depends largely upon the structure of the product, the material used therefor, etc.

As understood from the above, it should be very important, in order to effectively decrease the environmental load throughout the product life cycle, to determine a design concept by the use of the LCP apparatus 20 at an early stage of designing process and thereafter to form a concrete structural model by the use of the CAD apparatus included in the deployment assistant unit 30. And it is desirable that at the succeeding stage evaluation and improvement are made of the designed object by the use of various evaluation apparatuses included in the evaluation assistant unit 40.

This flow of procedure is in conformity with the user's issues settlement cycle of "awareness of problem", "suggestion", "development", "evaluation" and "decision". It is a very adequate assisting procedure from the viewpoint of the designing efficiency as well.

Moreover, since at the initial stage of designing a clear concept for designing an environmentally conscious product is already prepared, even when a joint designing operation is performed between a plurality of designers in the designing process that thereafter succeeds, it is possible to perform their operation according to such a clear designing concept and therefore to design a product of which the designing idea is unified.

For the above-described reasons, the sequence of using the respective designing assistant units in the designing process can be defined as in FIG. 2, and this is most reasonable.

[Designing Assistance Example of Product Designing Stressed on Environmental Consciousness]

Next, an example of designing assistance for designing an environmentally conscious product will be concretely explained, referring to FIG. 2.

[Step S1] A person in charge of product designing determines a concept for designing an environmentally conscious product by the use of the LCP apparatus 20. At this time, the LCP apparatus makes use of the design evaluation results and material constitution data of existing products as well that are stored in the product environmental information database.

[Step S2] A structural model is prepared using the CAD apparatus included in the assistant unit 30. At this time, selection is made of a material that uses no harmful and environmentally concerning substances as much as possible.

[Step S3] Evaluation is made of the design output by the use of the LCA apparatus and the EOL evaluation apparatus.

[Step S4] If the evaluation results that are obtained using the respective apparatuses in the step S3 are determined all as being permissible, the flow proceeds to the next step. If they are out of the permissible range, the flow returns back to the step S2.

[Step S5] The design output is compared with alternate design plans and evaluated by the use of the decision-make assistant unit 50. At this time, using the importance levels on the designing issues that are output from the LCP apparatus 20, the comparison results are processed into a form such that facilitates the decision making, and it is used.

[Step S6] A determination is made of the design output to be adopted by the use of the results in the step S5. If no permissible designing is output, return to the step S2 or the step S1.

(Modified Example of the Designing System)

Next, explanation will be made on the designing system according to another embodiment of the present invention.

Here, it is to be noted that the designing system explained here is constructed of the following designing assistant apparatuses or units. Namely, it comprises:

an assistant unit for issues presentation and proposition containing an LCP apparatus 20 and a QFD apparatus 10;

a development assistant unit 30 containing a CAD apparatus and a material selection assistant apparatus;

an evaluation assistant unit 40 containing a LCA (Life Cycle Assessment) apparatus, a product after-use (EOL: End Of Life) evaluation unit, a CAE (Computer Aided Engineering) apparatus, an assembling ease evaluation unit and an LCCA (Life Cycle Cost Assessment) apparatus; and a decision-making assistant unit 50 containing a decision-make assistant apparatus.

And the QFD apparatus 10 assists to perform sequential deployments from the VOC (Voice Of the Customer), through the functional constructions that are requested by the users, to the technical means for realizing such functional constructions. As a result of this, the designer or designers can form a concept for a product that has the power of competition in the markets.

The CAD unit of the development assistant unit 30 performs formation of a product configuration and structural model. The material selection assistant apparatus assists selection of a material that is suitable from the viewpoints of the safety level, resources preservation level, environment preservation level, treatability and disposability level, and recycling ease level. The material selection assistant apparatus is especially characterized by determining environmentally concerning materials from the viewpoint of the safety level and environment preservation level and by searching replaceable materials so as not to use such materials to an extent that is as large as possible.

The LCA apparatus of the evaluation assistant unit 40 calculates the environmental load that occurs through the product life cycle (inventory analysis) and evaluates the effect of them on the environment (impact analysis). Accordingly, if evaluating the design output (the product and the product life cycle process) by the use of the LCA unit and improving the design on the basis of the evaluation results, it is possible to decrease the environmental load. Moreover, using the data that is obtained from the inventory analysis, it is also possible to calculate the amount of resources input, the amount of materials disused, the amount of energy consumed, etc.

The FOL evaluation apparatus included in the evaluation assistant unit 40 evaluates the design conformability level to the respective issues after use of the product, and has an upgradability evaluation function, maintenability evaluation function, reusability evaluation function, and recyclability evaluation function. In the upgradability evaluation, calculation is performed of the ratio of use of the parts and materials constituting the product which can be upgraded, and of the replacing operation efficiency of them. In the maintenability evaluation, calculation is performed of the ratio of use of the parts and materials constituting the product, which can be maintained and impaired, and of the replacing operation efficiency of them. In the reusability evaluation, calculation is performed of the ratio of use of the parts and materials constituting the product, which can be reused, and of the extracting operation efficiency of them. In the recyclability evaluation, calculation is performed of the ratio of use of the parts and materials constituting the product, which can be material-recycled, and of the disassembling operation efficiency of them.

The CAE apparatus that is in the evaluation assistant unit 40 performs simulation regarding the performance of the product. The assemblability evaluation apparatus that is in the unit 40 estimates the number of steps that are necessary for assembly and assists to minimize the number of the assembling steps. This assistance also includes optimization of the assembling procedures.

Moreover, the LCCA apparatus of the evaluation assistant unit 40 estimates the cost that is incurred over the entire product life cycle that covers the range from the acquisition of materials to the disposal of the product.

The decision-make assistant unit 50 synthetically compares a plurality of alternate design solutions and makes evaluation thereof, according to the environmental strategy determined by the LCP apparatus and the design specification determined by the QFD tool, thereby assisting determination of a final designing output.

Moreover, there is provided a product environmental information database that synthetically holds in common and manages the product environmental data that is used in each of the above-described respective assistant units. As data that is stored in this database, there are, for example, "the amount of resources consumed", "the amount of energy consumed", "the degree of ozone layer destruction, "material constitution data", etc.

It is to be noted that although each of the above-described various assistant units may be an independently separated unit, it is more realistic to make up the operation of each of the above-described assistant units into an application software and to adopt a form wherein this software is used on a general-purpose computer. Because that makes the cost more inexpensive and the handling easier since computers have been developped to be made small in size and high in performance. A hardware construction of the entire designing assistant system of this embodiment that realizes the subject matter of the invention on such a general-purpose computer is illustrated in FIG. 3.

Specifically, FIG. 3 is a schematic construction view Illustrating the system of the present invention. As illustrated, this system of the invention is equipped with a memory 11 in which there are stored a group of tools (tool application programs such as 'tools for assisting the awareness of problem and suggestion (LCP apparatus 20 realizing application, QFD apparatus 10 realizing application)', 'tools for assisting development (CAD apparatus realizing application, material selection assistant apparatus realizing application)', 'tools for assisting evaluation (LCA apparatus realizing application, product-after-use (EOL) evaluation apparatus realizing application, CAE apparatus realizing application, assemblability evaluation apparatus realizing application, LCCA apparatus realizing application)', 'tool for decision-make assistant unit (decision-make assistant apparatus realizing application)') and other programs, a CPU (processor) 12 that executes the programs, makes calculations, performs input/output processings and performs various control operations, etc. an input device 13 such as a keyboard, a mouse or a track ball, that is used to perform the input operation, an output device 14 such as a display, a printer or a plotter, that is used to output the contents of the input, processing results, etc., a display device (display) 18 that is used to display the contents of the input, processing results, etc., a large capacity external storage 15 that accumulates the processing results, past data or the like or that holds a database or the like therein, a communication interface 16 that is connected to a network or the like and thereby used for making a communication, etc. Moreover, the present system is provided with a portable storage medium drive unit compatible with a portable medium, such as a magnetic floppy drive unit, photo-disk drive unit or a memory card drive unit, which in a case where the above-described various tools are distributed in a state of programs stored in various portable storage media such as a floppy disk, photo-disk or memory card, enables data to be read from such storage media and executed by the CPU 12.

According to this construction; the system performs the above-described processings. Namely, by executing the application for use as realizing the QFD apparatus, it is assisted to proceed sequential deployments, starting from the VOC, through the functional constructions that are requested by the users, to the technical means for realizing such functional constructions. Further, by executing the application for use as realizing the LCP apparatus, it is possible to select the effective technical means for decreasing the environmental load. As a result of this, the designer or designers can establish a concept for an environmentally conscious product that has the power of competition in the markets.

The application for realizing the CAD apparatus included in the deployment assistant unit 30 performs to form the product configuration and the structural model. The material selection assistant apparatus realizing application assists the selection of suitable materials from the viewpoint of the safety level, resources preservation level, environment preservation level, treatment/disposal level, recycle level. etc. Especially, this application determines environmentally concerning substances from the viewpoint of the safety level and environment preservation level and makes operation of searching replaceable materials so as to exclude such substances to an extent as large as possible.

The LCA apparatus realizing application calculates the environmental load that occur during the product life cycle (inventory analysis) and thereby evaluates the effect of it on the environment (impact analysis). Accordingly, if evaluating the design output (the product and the product life cycle process) by the LCA apparatus realizing application and improving this designing output on the basis of the evaluation results, it is possible to decrease the effect on the environment. Moreover, by using the data obtained by the inventory analysis, it is possible to calculate the amount of energy consumed as well as the amount of resources input and the amount of materials disused.

The EOL evaluation apparatus realizing application evaluates the degree of conformity to the respective issue items after use of the product and thereby performs the upgradabllity evaluation, maintenability evaluation, reusability evaluation and recyclability evaluation. In the upgradability evaluation, calculation is performed of the ratio of using the parts and materials constituting the product which can be upgraded, and of the replacing operation efficiency of them. In the maintenability evaluation, calculation is performed of the ratio of using the parts and materials constituting the product which can be maintained and repaired, and of the replacing operation efficiency of them. In the reusability evaluation, calculation is performed of the ratio of using the parts and materials constituting the product which can be reused, and of the disassembling operation efficiency for them. In the recyclability evaluation, calculation is performed of the ratio of using the parts and materials constituting the product which can be material-recycled, and of the disassembling operation efficiency of them.

The CAE apparatus realizing application performs simulation regarding the performance. And, the assembly level evaluation apparatus realizing application estimates the number of steps that are necessary for assembly and assists so that the number of assembling steps may be minimized. At this time, optimization of the assembling procedures is also performed.

Moreover, the LCCA apparatus realizing application estimates the amount of the cost that is incurred over the entire product life cycle covering the supply of materials to the disuse of the product.

The decision-make assistant unit realizing application synthetically compares a plurality of alternate design plans with one another, and evaluates them, on the basis of the environmental strategy that has been determined by the LCP apparatus realizing application and the design specification that has been determined by the QFD tool, thereby assisting the determination of a final design output.

As described above, in the present designing system, it is repeated to make up a life cycle plan for a product, select materials with a stress being put on the environmental issues, perform the product designing, evaluate the thus-designed product and also evaluate the matters that are presumed to occur from the provision of the product to the user to the disposal of it by him, while coordinating various parameters, until the best design is obtained. As a result, according to this designing system, it is possible to assist over and throughout the entire designing process.

FIG. 4 illustrates an example wherein the designer's problem solving cycle and the progress of the designing process that is stepwise made are simultaneously depicted and the timings of applying various assistant units constituting the designing system are shown on this depiction. The processing stages proceed in such a way as 'planning' stage, 'conceptual design' stage, 'embodiment design' stage, and 'detailed design' stage. Principally, "awareness of problem" is performed at the 'planning' stage, "suggestion" and "decision" are performed at the 'conceptual design' stage, "development", "evaluation" and "decision" are performed at the 'embodiment design' stage, and "development", "evaluation" and "decision" are performed at the 'detailed design' stage. The progressing of the processings in such a sequential order is visually shown in the figure.

It is to be noted that, in a case where the product to be designed is small on the scale of designing, there may be sometimes no clear distinction between the embodiment design stage and the detailed designing stage.

[Implementation of the LCP System]

Next, an implementation of the LCP system will be explained. The issues in the ECP designing are constructed on the environment, cost and performance. In other words, it is required in the ECP designing, as a matter of course, to take the designing issues associated with the environment into consideration, in addition to the conventional designing issues associated with performance and cost.

The designing issues regarding the environment is classified into two types, 'environmental issues' and 'an EOL issue'.

On the other hand, the life cycle process is modeled into five phases, "material acquisition", "manufacturing", "distribution", "usage" and "disposal".

Namely, the life cycle of the product has phases of "material acquisition", "manufacturing", "distribution", "usage", and "disposal". Using the materials which have been supplied by the "material acquisition", "manufacturing" of a product is performed and this product is subjected to "distribution" and is handed to a user. The user gets the product in hand and subject it to "usage". Eventually, the user disuses the product as an unnecessary. The stage at which this product is disused as an unnecessary is "after use" and, at this "after-use" stage, the disused product is recycled or subjected to "disposal".

<Importance Level Decision Assistance on Environmental Issues and EOL Issue>

First, the environmental issues are basically set as five issues as follows, which are also shown in FIG. 5.

[1] resource saving
[2] energy saving
[3] waste reduction
[4] harmfulness reduction
[5] reduction of the environmental impacts The 'reduction of the environmental impacts' under the issue [5] above is one that has been so termed by generically naming for several impact categories that include the ozone layer protection, warming prevention; etc. Therefore, if preferable, it is of course possible to set one of those impact categories as another environmental issue independent from the issue [5]. This will be sometimes more useful to meet the trend of the public opinion. Similarly, any of the detailed items of the environmental issues which are encompassed in the issues [1] to [4] may be independently set as occasion arises.

The above five environmental issues can be evaluated by the LCA apparatus.

Figure 6:
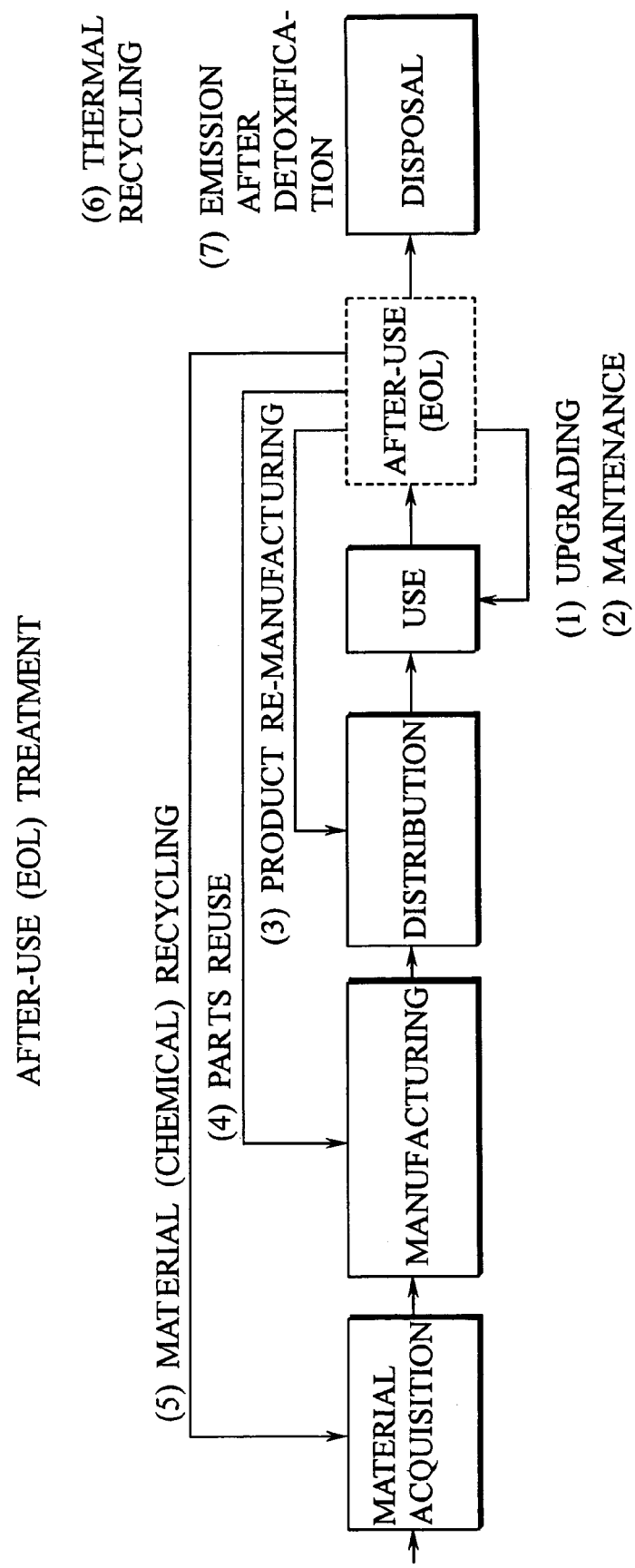
FIG. 6 is a view taken for explanation of the processing in the present invention, which illustrates the treatment made after use of a product (at EOL: End Of Life) In the designing assistance of the present invention.

FIG. 6 illustrates a material flow after use of the product (EOL). At this time, the following items can be enumerated as options at the EOL.

(1) upgrading
(2) maintenance
(3) product re-manufacturing
(4) parts reuse
(5) material (chemical, metallurgical) recycling
(6) thermal recycling, and
(7) emission after detoxification The recycle at the "after-use" stage includes "upgrading" for reusing the product by replacing the parts by those having a higher performance or newest type ones, "maintenance" for reusing the product by repairing malfunctional portions thereof, "product re-manufacturing" for having the product used by a new user by causing it to be circulated into a secondhand goods market, "parts reuse" for recovering usable parts and returning them to the manufacturing stage, and "material (chemical) recycling" for recovering usable materials and using them again as materials. Also, the disposition includes "thermal recycling" for burning the product and recovering it as heat and "emission after detoxification" for making waste matters harmless and abandoning them.

Here, the difference between the "(3) product re-manufacturing" and "(2) maintenance/(1) upgrading" resides merely in the difference in the possession of the product ownership, and, as technical realizing means, no difference exists between them. Namely, the former is merely that the product ownership is transferred to another user, while, on the other hand, the latter two are that the same user continues to use. The difference is only who uses.

Accordingly, in the following description, the matter by causing the product re-manufacturing is considered as being included in maintenance performing or upgrading. Moreover, since the items (6) and (7) can be handled as the environmental issues at the phase of the "disposal" under the life cycle process as previously referred to, these two items are excluded from the EOL issues.

For these reasons, in the present invention, object items of the EOL issue are set to be (1), (2), (4) and (5).

The conformability to the above EOL issues can be evaluated by the EOL evaluation unit.

Figure 7:
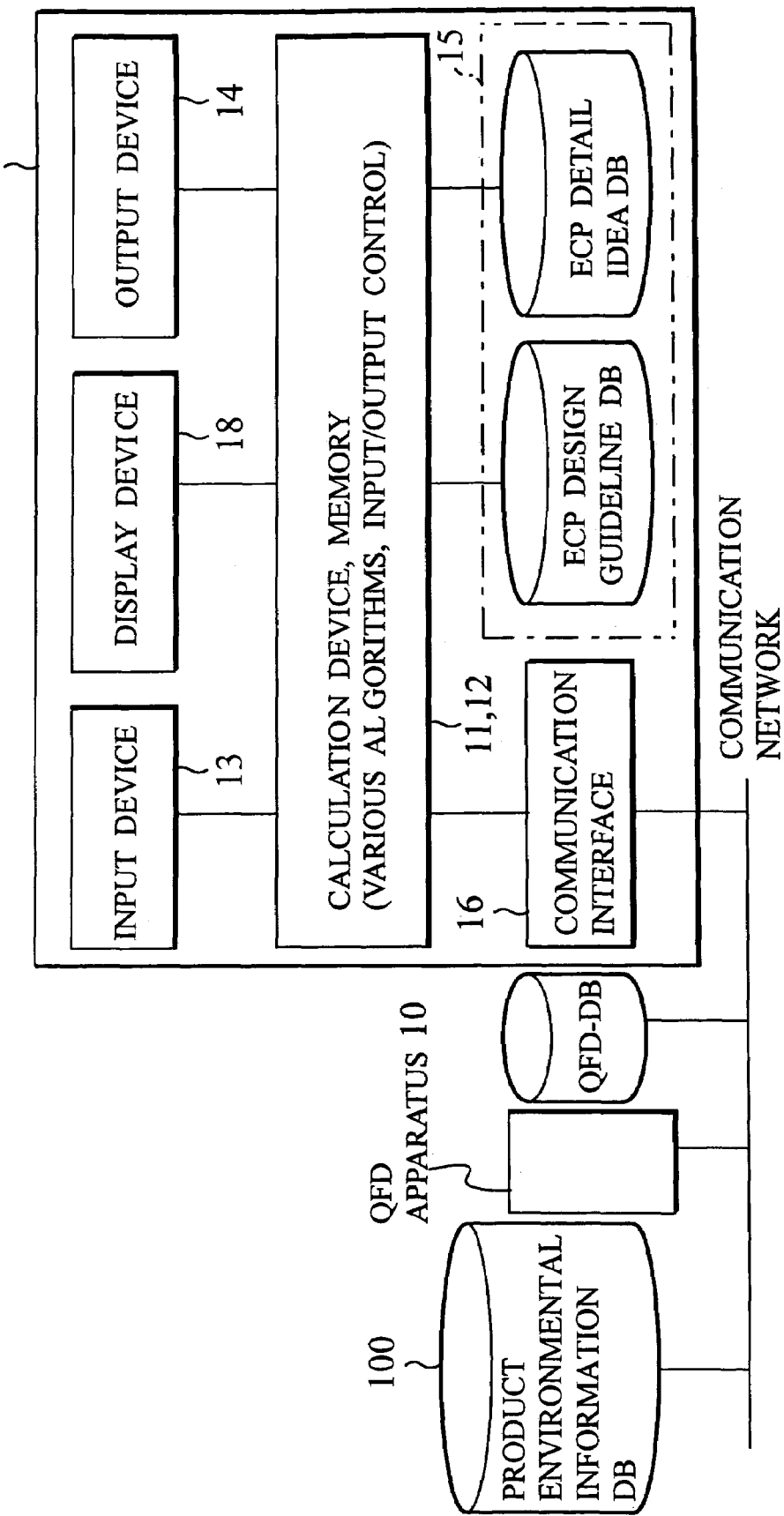
FIG. 7 is a view taken for explanation of the present invention, which is a block diagram illustrating a system construction example of an LCP system in the designing system of the present invention.

In FIG. 7, illustration is made of a system construction example of the computer-aided product life cycle planning system. The computer-aided product life cycle planning system is composed of a product environmental information database 100, a QFD database, a QFD apparatus 10 and an LCP apparatus 20. Here, since each of the product environmental information database 100 and the QFD apparatus 10 is separate from the LCP apparatus 20, necessary data for this apparatus 20 is handled through transmission and reception of data between the former and the latter.

The LCP apparatus 20 performs assistance of making decision of the importance levels on the environmental issues in the course of the life cycle process, in accordance with the flow which is illustrated in FIG. 8A. Here, explanation will be made referring to FIG. 5 which illustrates an example of a case where the product is set to be a refrigerator.

First, a planner or designer inputs, into a matrix defined by the phases of the life cycle and the environmental issues such as that having a form illustrated in FIG. 5, designing items that are associated with the respective matrix elements (step S21 in FIG. 8A).

Next, as illustrated in FIG. 32, of the designing items that have been input, a few items are set at designer's will to fall under aimed elements (step S22 in FIG. 8). For example, those which are associated with product users, the self company, stakeholders and the like are selected. In an example of FIG. 32, the electricity saving mode improving and the packaging reduction are associated with the product users, and the legal regulation is associated with the enterprise activities of self company. Therefore, these items are set to fall under aimed elements. Regarding the aimed elements, the product environmental data of each of a bench mark product (this product may be a product of another competitive company) that is a target product and a self company conventional product to be improved is read in from the product environmental information database (FIGS. 33 and 34) (step S23 in FIG. 8A). Here, the name of the evaluation data indicating attainment levels for each of the environmental issues is displayed on each box for these issues. And the ratio in the data of the self company conventional product relative to the bench mark product is respectively calculated (FIG. 35) and a display thereof is made on a display device (step S24 in FIG. 8).

In the example of FIG. 35, in the region whose value is greater than "1", the self company conventional product is inferior to the bench mark product and, in the region whose value is smaller than "1", the self company conventional product is superior. On the basis of data indicated in FIG. 35, the relative importance levels on the design are set into the aimed elements as in FIG. 36A (steps 25 and 26 in FIG. 8A).

In this case, the relative importance levels on the design is set to be high in the weakest elements, and is set to be low in the elements whose value is already higher in order than the value of the bench mark product. Setting of the importance levels can be executed in the form of an algorithm according to this embodiment shown in FIG. 8A. Moreover, it can also be accompanied with the designer's judgment being taken thereinto. In this case, as shown in FIG. 8B, the operation flow includes the step S25' of correcting or changing the importance levels by the designer, and the correction made on the importance levels is, for example, as shown in 36B. Moreover, the quantitative target value in each aimed region is determined by the designer, in this implementation, on the basis of the data in FIG. 36A (step S26). This step may be omitted.

In an example of FIG. 36A, the value of each element is further normalized by the use of a total sum (=5, 38) of the values in FIG. 35.

FIG. 9 illustrates the operation cooperation relationship between the application program according to the present invention and an operating system (OS).

Figure 10:
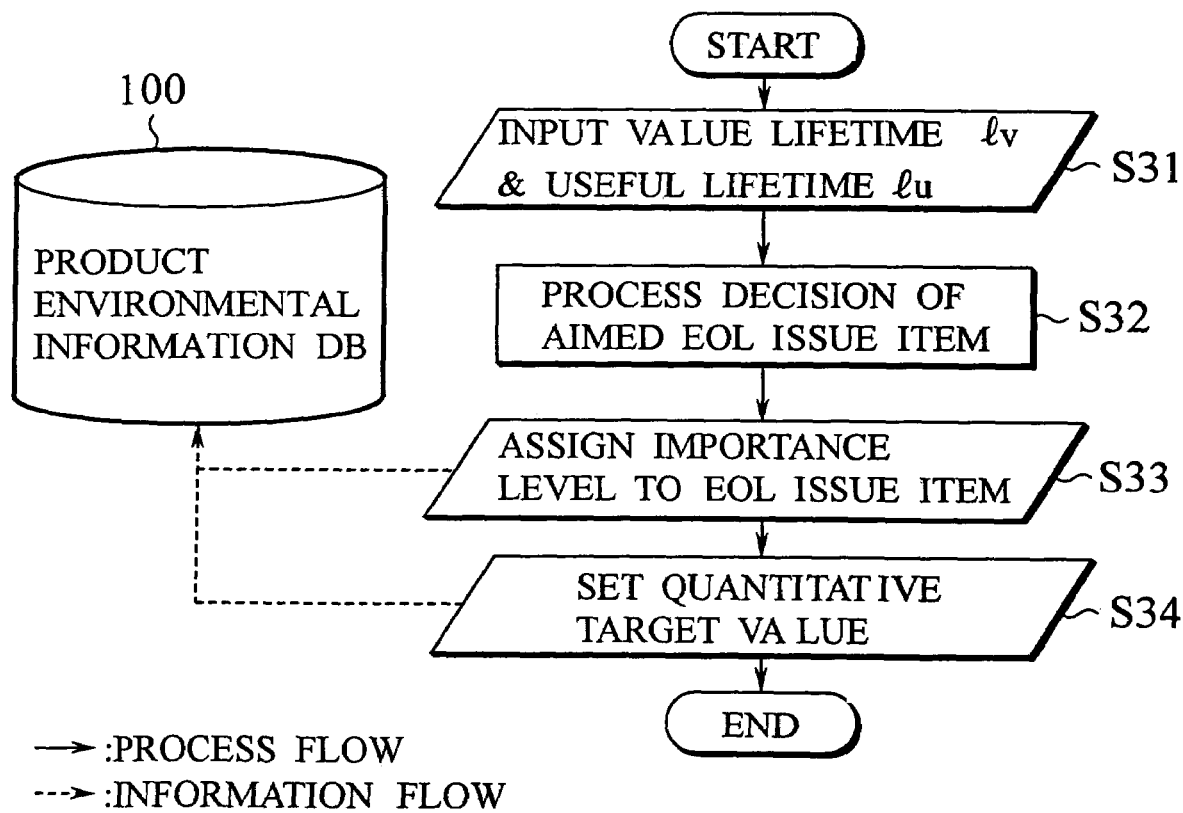
FIG. 10 is a view taken for explanation of the present invention, which is a flowchart illustrating the flow of the importance level decision assistant processing for the EOL issue, used in the designing assistance of the present invention.

Next, an explanation will be given of assistance to a decision of importance levels on the EOL issue. In the assistance performed here under this item, as shown in a flow of assisting a decision of the relative importance revels on the EOL issue illustrated in FIG. 10, first two lifetimes that are a value life lv (lifetime based on the value of product) in the market and a useful life lu (physically usable and durable lifetime) of the product to be designed are input (step S31).

Here, the value life lv indicates the term that lasts until the product value (cost, performance) relatively decreases depending on external factors such as technical development, market trend, user's needs, etc. and, due to this decrease, reaches a time when EOL comes. On the other hand, the useful life lu indicates the term that lasts until the product becomes unable to exhibit its initial performance due to, for example, physical degradation and reaches a time when EOL comes.

Next, using the values of the value life lv in the market and durable life lu of the object product, determination is made of the aimed items of EOL issue (steps S32 to S34).

Figure 11:
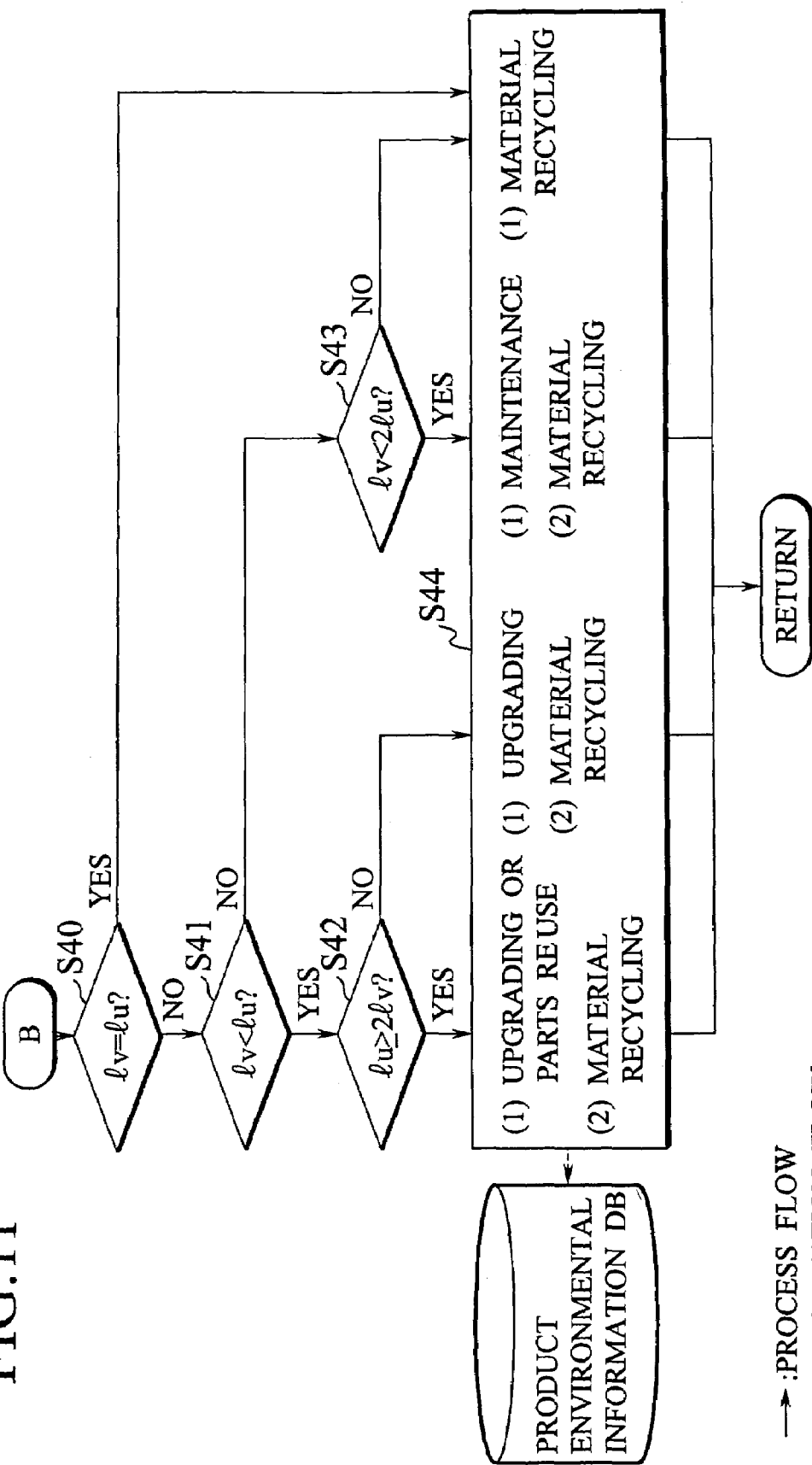
FIG. 11 is a view taken for explanation of the present Invention, which is a flowchart illustrating the flow of a processing of determining aimed EOL issue items, used in the designing assistance of the present invention.

Namely, as illustrated in FIG. 11, using the values of the value life lv in the market and useful life lu of the object product, it is judged whether lv=lu is right or not (step S40). If lv=lu is right, setting is made to be "material recycling" (step 44). If not, it its judged whether lv<lu is right or not (step S41). If lv<lu is right, it is further judged whether lu≧2lv is right or not (step S42). If lu≧2lv is right (lv≧0.5 lu), setting is made to be "upgrading" or "parts reuse", or "material recycling" as a second choice (step S44). If lu≧2lv is not right (0.5lu<lv<lu) as a result of the judgement made in step S42, setting is made to be "upgrading" or "material recycling" (step S44). If lv<lu is not right as a result of the judgement made in step S41, it is further judged whether lv<2lu is right or not (step S43). If lv<2lu is right (lu<lv<2lu), setting is made to be "maintenance" or "material recycling" (step S44). If lv<2lu is not right (2lu≦lv) as a result of the judgement made in step S43, setting is made to be "material recycling" (step S44).

Conceptual views for explaining this flow for clear understanding thereof are illustrated in FIGS. 12 to 15.

Figure 12:
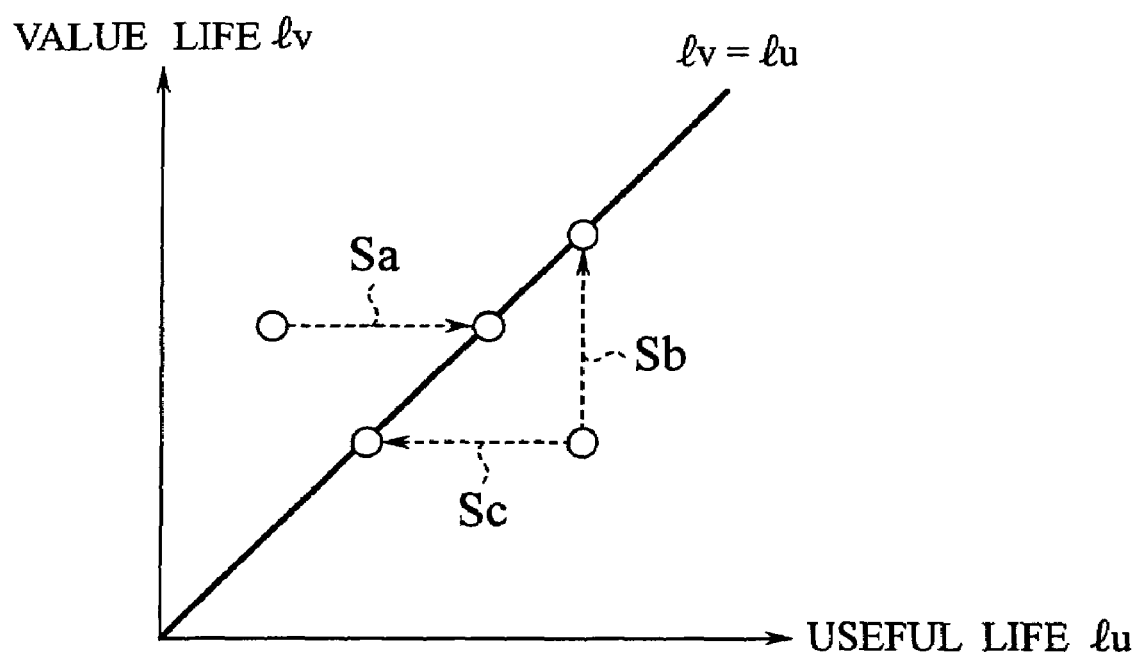
FIG. 12 is a view taken for explaining the present invention, which is a flowchart illustrating the concept of a processing of determining aimed EOL issue items, used in the designing assistance of the present invention.
Figure 13:
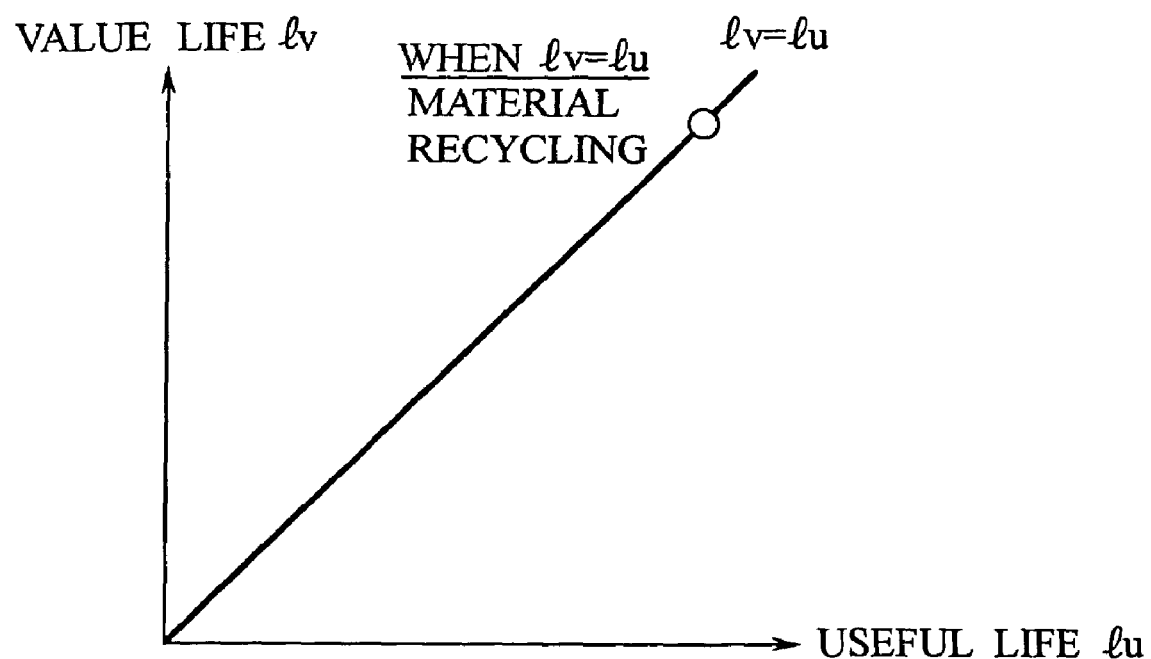
FIG. 13 is a view taken for explanation of the present invention, which is a flowchart illustrating the concept of a processing of determining aimed EOL issue items, used in the designing assistance of the present invention.

In the present invention, it is considered as being important that the product is located on the line of lv=lu in a plane [lv−lu], that is, no disuse is made with the value thereof remaining to exist therein (or, the value of the product is completely used up) (FIG. 12).

On this account, as seen from the directions Sa, Sb, Sc of FIG. 12, the direction of solution must depends on the largeness/smallness relationship of the value life lv in the market and the useful life lu of the object product at the time of initial inputting, and the item of EOL issue to be aimed at may be different between the products which are different in the value life or the useful life.

First, in a case where the lv (the value life in the market of the object product) at the time of inputting is equal to the lu (useful life) (FIG. 13), it becomes the most important to make a design directed toward the material recycling, since it is possible to use up the value of the product already in the market according to the conventional manner.

Figure 14:
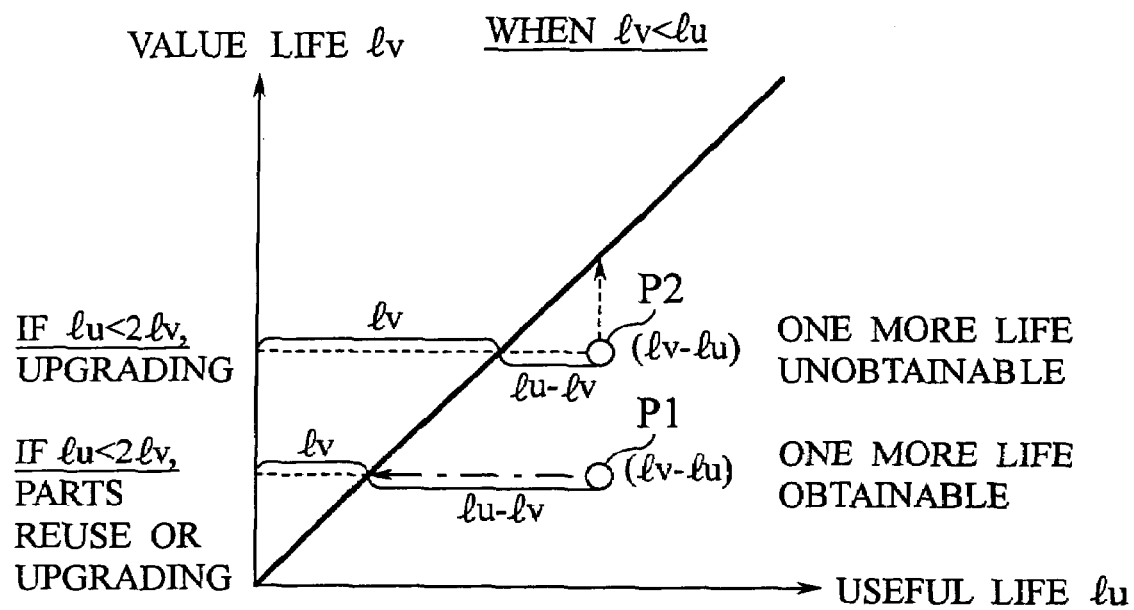
FIG. 14 is a view taken for explaining the present invention, which is a flowchart illustrating the concept of a processing of determining aimed EOL issue items, used in the designing assistance of the present invention.

On the other hand, in a case as shown in FIG. 14 where the value life lv in the market of the object product is smaller than the useful life lu, the item of EOL issue to be aimed at is determined further under the following conditions.

lu<2lv (0.5 lu<lv<lu): a stress is put on upgrading, since one more life is unobtainable even if parts are reused for another product, and lu>2lv (lv≦0.5 lu): a stress is put on parts reuse or upgrading.

In FIG. 14, the example cases for personal computers P1 and P2 are shown, in which the lv for the computer P1 is three years, the lv for the computer P2 is four years and the lu of the computers is seven years. For the computer P1, part reuse or upgrading is important and, for the computer P2, upgrading is important.

Figure 15:
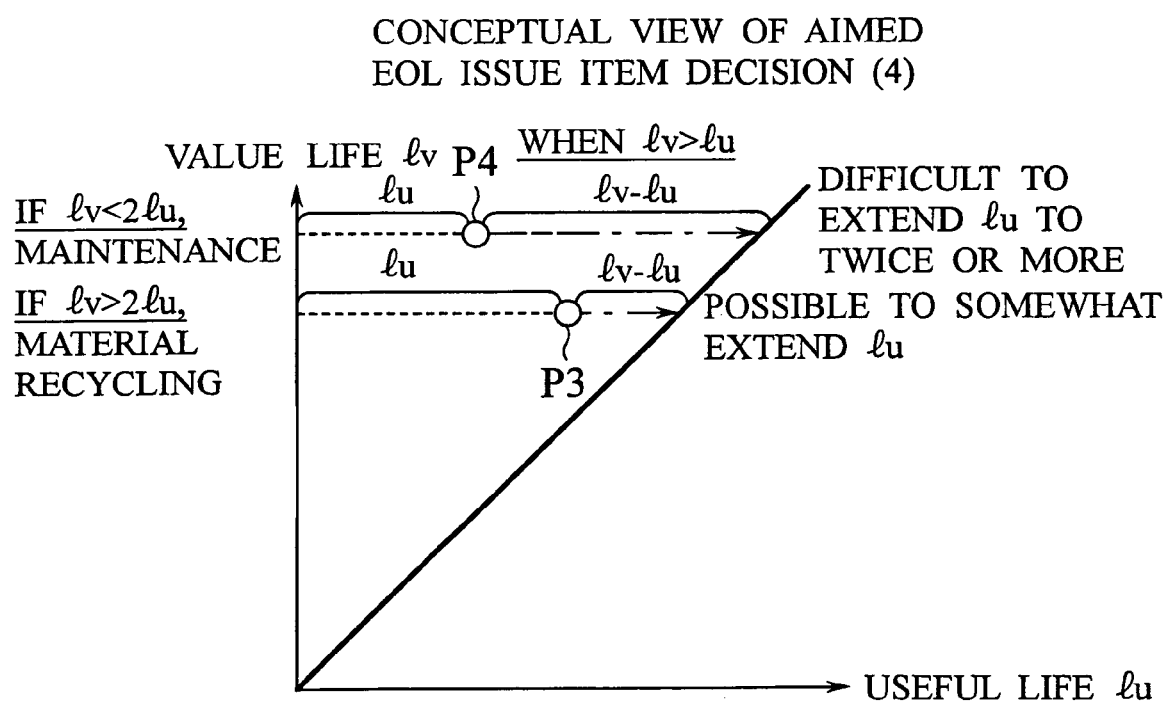
FIG. 15 is a view taken for explaining the present invention, which is a flowchart illustrating the concept of a processing of determining aimed EOL issue items, used in the designing assistance of the present invention.

Also, in a case as shown in FIG. 15 when the value life lv in the market of the object product is larger than the useful life lu, the item of the EOL issue to be aimed at is determined further under the following conditions.

lv<2lu (lu<lv<2lu): a stress is put on maintenance, since it is possible to extend the life to lv by only once maintenance, and lv>2lu (2lu≦lv): a stress is put on material recycling, since extension of life to twice or more (=lv) is difficult by only once maintenance.

In FIG. 15, the example cases for a refrigerator P3 and a stapler P4 are shown, in which the lv and the lu for the refrigerator P3 are 15 years and 12 years, and the lv and the lu for the stapler P4 are 20 years and 8 years. For the refrigerator P3, maintenance is important and, for the stapler P4, material recycling is important.

Then, for example, in a case where considering a refrigerator as the object product, setting its value life lv in the market being 15 years and setting its durable life lu being 12 years, it is guided, along the processing flow of FIG. 11, to cause the "(1) maintenance" and the "(2) material recycling" to be aimed at in this order. Therefore, the importance levels are distributed to each of these two regions in accordance with the above result.

FIG. 16 illustrates the operation cooperation relationship between the application program according to the present invention and an operating system (OS).

FIG. 17 illustrates an example of the importance levels (=environment strategy) on the designing issues associated with the environment issues regard the object product (refrigerator for this case). The data of these importance levels is stored in the product environmental information database and is used during the succeeding designing process, as necessity arises. In this implementation, a high importance level is assigned to the ozone layer protection at the disposition phase as well as to the improvement in the maintenance after EOL.

<ECP Design Guideline & ECP Detail Idea Retrival>

Figure 18:
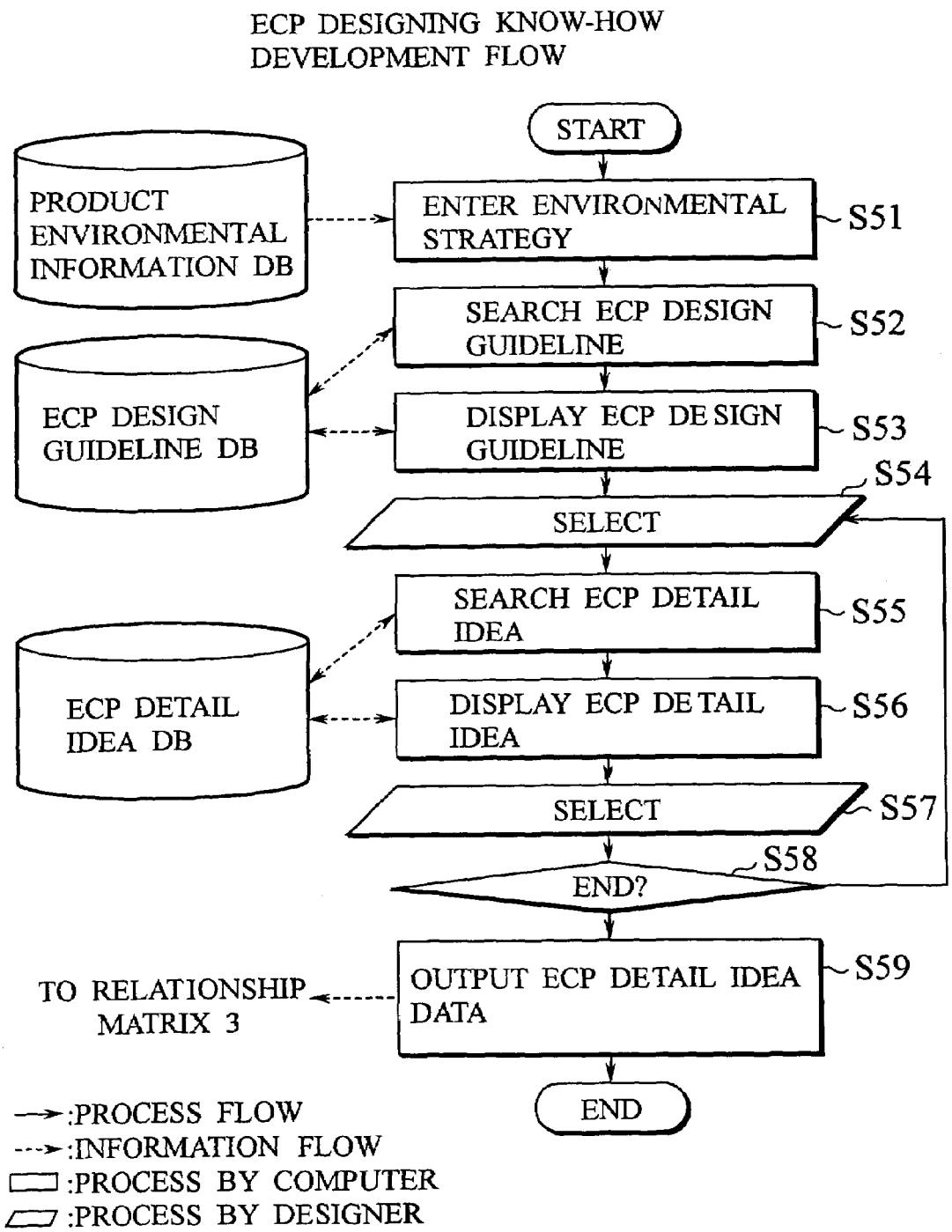
FIG. 18 is a view taken for explaining the present Invention, which is a flowchart illustrating the flow of an ECP designing know-how deployment processing, used in the designing assistance of the present invention.

Next, an ECP design guideline flow that uses the above-described importance levels will be explained with reference to FIG. 18.

Step S51: the LCP apparatus operates to take the importance levels (environment strategy) described above thereinto.

Step S52: the apparatus automatically searches an ECP design guideline that is effective for the designing issue to which a high importance level is assigned, by the use of the data on the ECP design guideline database.

Step S53: the apparatus displays the ECP design guideline that has been searched.

Step S54: the designer selects an ECP design guideline that he expects as being suitable.

Step S55: the apparatus automatically searches a concrete ECP detail idea for realizing the ECP design guideline that has been input thereinto, by the use of the data on the ECP design guideline database unit.

Step S56: the apparatus displays the ECP detail idea that has been searched.

Step S57: the designer selects an ECP detail idea that he considers to apply.

Step S58: the designer's operation ends when applicable detail idea has all been selected. If not, the flow returns to step S54 or step S56.

Through the execution of the above-described procedures, the designer can select an ECP detail idea that is the most effective for the object product and that is considered to be applicable to actual designing. In addition, the designing concept also becomes clarified.

Here, the automatic search processing in step S52 is executed in accordance with the following procedures. In the procedures, the following numeral items are used which are defined below.

i: issue number of the environmental issues (wherein i is a natural number of 1 to I).

J: phase number of the life cycle process (wherein j is a natural number of 1 to J), Eij: matrix item (element) number of the environmental issues at the phases of the life cycle process (wherein i and j are the same as above), k: item number of the EOL issue (wherein k is a natural number of 1 to K), m: guideline number of the ECP design guidelines (wherein m is a natural number of 1 to M), Pim: point evaluating effectiveness of the design guideline m to resolution of the environmental issue i.

Pjm: point evaluating a concern of the design guideline m with the life cycle phase j, and Pkm: point evaluating effectiveness of the design guideline m to resolution of the EOL issue item k.

(Wherein I, J and K of the described example case are respectively 5, 5 and 4).

First, defining that Wij represents the importance level of the 'environmental issue i' at the 'life cycle phase j' or the environmental issue item Eij, and that Wk represents the importance level of the 'EOL issue item k', the following equations are made among the importance levels WiJ, Wk shown in FIG. 36A.

$$\sum_{i=1}^{I}\sum_{j=1}^{J} Wij = 1$$

$$\sum_{k=1}^{K} Wk = 1$$

Then, since the point evaluating effectiveness of the environmental issue i at the phase j of the life cycle process, or the environmental issue item Eij, is obtained by Pim·Pjm, the total point Pm(ENV) that is integration of the product of Pim·Pjm and the importance level Wij represents a total effectiveness of the design guideline m to the environmental issues 1 to I at the phases 1 to J. Similarly, the total point Pm(EOL) that is integration of the product of Pkm and the importance level Wij represents a total effectiveness of the design guideline m to the EOL issue items 1 to K.

$$Pm(ENV) = \sum_{i=1}^{I}\sum_{j=1}^{J} Wij \cdot Pim \cdot Pjm$$

$$Pm(EOL) = \sum_{k=1}^{K} Wk \cdot Pkm$$

Therefore, after the importance levels W are given by the operation as described above, the Pm(ENV) and Pm(EOL) above can be calculated. In this connection, the design guidelines that satisfy the formula: Pm>0 are regarded as those which can exhibit the effect presently. Moreover, they are more effective in the sequential order of design guidelines whose values are higher in magnitude. Accordingly, using the results of those calculations, effective ones of the desig guidelines can be automatically searched.

Also, the automatic search processing in step (S55) is performed in accordance with the following procedures.

First, the ECP design guideline m (m is a natural number of 1 to M) is regarded, beforehand, as falling under the category that is named "m", and, under this assumption, an ECP detail idea n (n is a natural number of 1 to N, and M≦N) which is a specific example is reverted beforehand to under any one of the design guideline named "m". In this condition. If a design guideline m has been designated, the detail idea n that is reverted thereto can immediately be searched.

FIGS. 19 to 21 illustrate examples of the contents of the data stored in the ECP design guideline database 100.

The ECP design guideline database 100 holds the data regarding 'design guidelines', 'environmental issues', 'life cycle process' and 'EOL Issue'. For the design guidelines, there are database-converted items such as, for example, "minimum use of non-recyclable scarce material", "maximum use of recyclable material", "maximum use of recycle materials", "minimizing consumption of material producing energy", "minimizing use of dangerous substances", "minimizing the amount of materials used". "minimizing the kinds of materials", "minimum use of non-replaceable materials", "minimizing the number of material colors", etc. For the 'environmental issues', there are database-converted items such as, for example, "resources saving", "energy saving", "waste reduction", "harmfulness reduction", "reduction of influence on the earth environment". For the 'life cycle process", there are items such as "material supply phase", "manufacture phase", "distribution phase", "use phase" and "disposition phase", and for 'EOL issue", there are items such as "upgrading", "maintenance", "parts reuse", and "material recycling".

A specific example of the data construction can be seen in FIGS. 19 to 21. The data items regarding the 'design guidelines', i.e., "minimum use of non-recyclable scarce material", "maximum use of recyclable material", "maximum use of recycle materials", "minimizing consumption of material producing energy", "minimizing use of dangerous substances", "minimizing the amount of materials used", "minimizing the kinds of materials", "minimum use of non-replaceable materials", "minimizing the number of material colors", etc. have been enumerated with the respective guideline numbers m, and these data items are associated respectively with the data items regarding the 'environmental issues', i.e., "resources saving", "energy saving", "waste reduction", "harmfulness reduction" and "reduction of influence on the earth environment" which are enumerated with the respective issue numbers i, in the form of, for example, a matrix for the environmental issues vs. the design guidelines as shown in FIG. 19. Also, data items of the design guidelines are associated respectively with the data items regarding the 'life cycle process', i.e., "material acquisition phase", "manufacturing phase", "distribution phase", "use phase" and "disposal phase" which are enumerated with the respective phase numbers j, in the form of, for example, a matrix for the life cycle process vs. the design guidelines as shown in FIG. 20. Moreover, the data items of the design guidelines are further associated respectively with the data items regarding the 'EOL issue', i.e., "upgrading", "maintenance", "parts reuse" and "material recycling" which are enumerated with the respective item numbers k, in the form of, for example, a matrix for the EOL issue vs. the design guidelines as shown in FIG. 21.

If a certain product is set by the designer as the product to be designed, the data for that product is entered from the ECP design guideline database 100 to those matrixes. Specifically, each element of the matrix of FIG. 19 is embedded with a datum for that product regarding effectiveness of the corresponding design guideline m for resolution of the corresponding environmental issue i, which is, for example, the point Pim described above. Each element of the matrix of FIG. 20 is embedded with a datum of the product regarding a concern level of the corresponding design guideline m with the corresponding phase j of life cycle, which is, e.g., the point Pjm described above. And each element of the matrix of FIG. 21 is embedded with a datum of the product regarding effectiveness of the corresponding design guideline m with the corresponding item k of the EOL issue, which is, e.g., the point Pkm described above.

Figure 22:
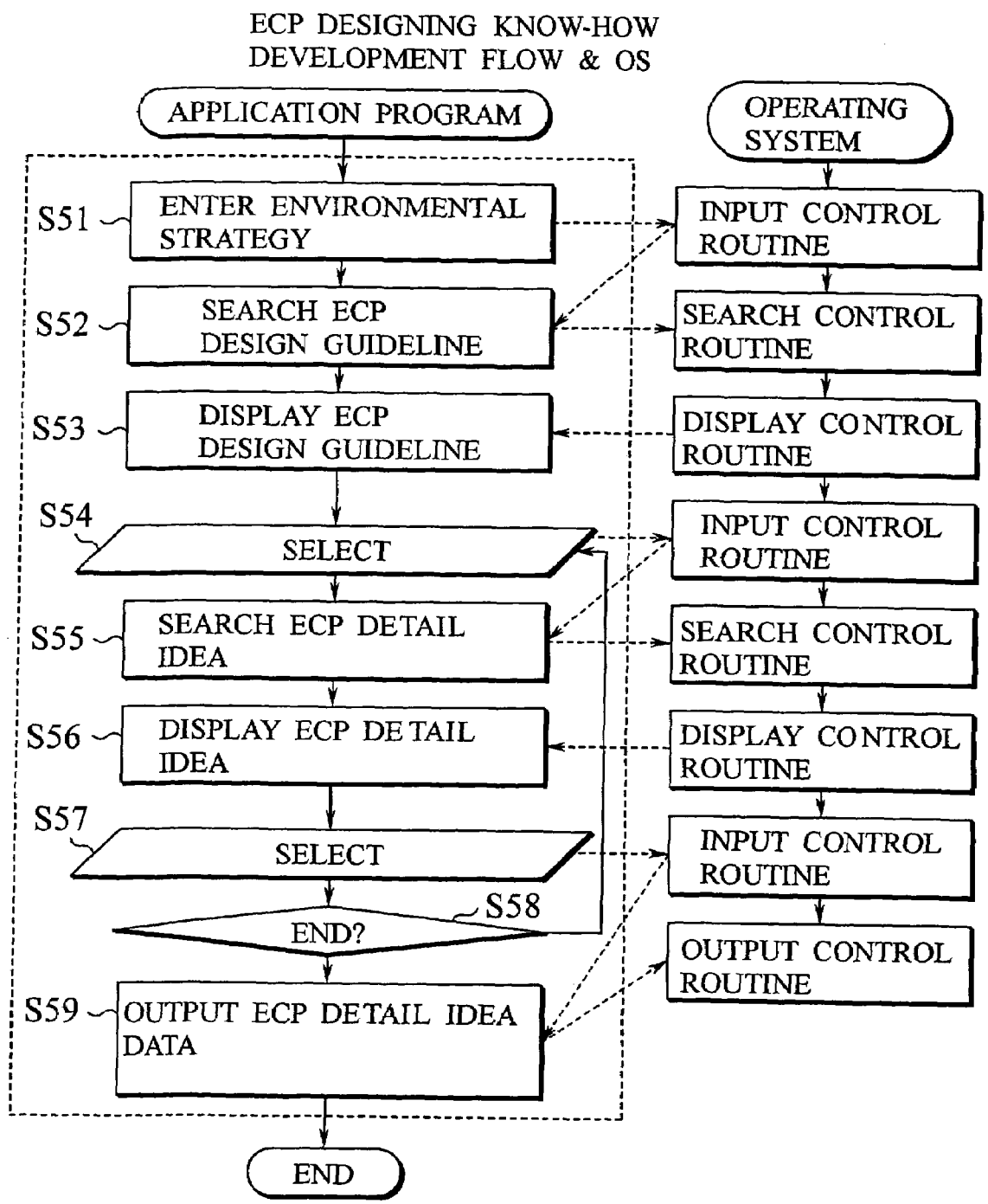
FIG. 22 is a view taken for explaining the present invention, which illustrates the operational cooperation relationship between an application program and an operating system (OS) that are used in an ECP design know-how deployment processing used in the designing assistance of the present invention.

FIG. 22 illustrates the operational cooperation relationship between the application programs and the operating system (OS) according to the present invention.

Figure 23:
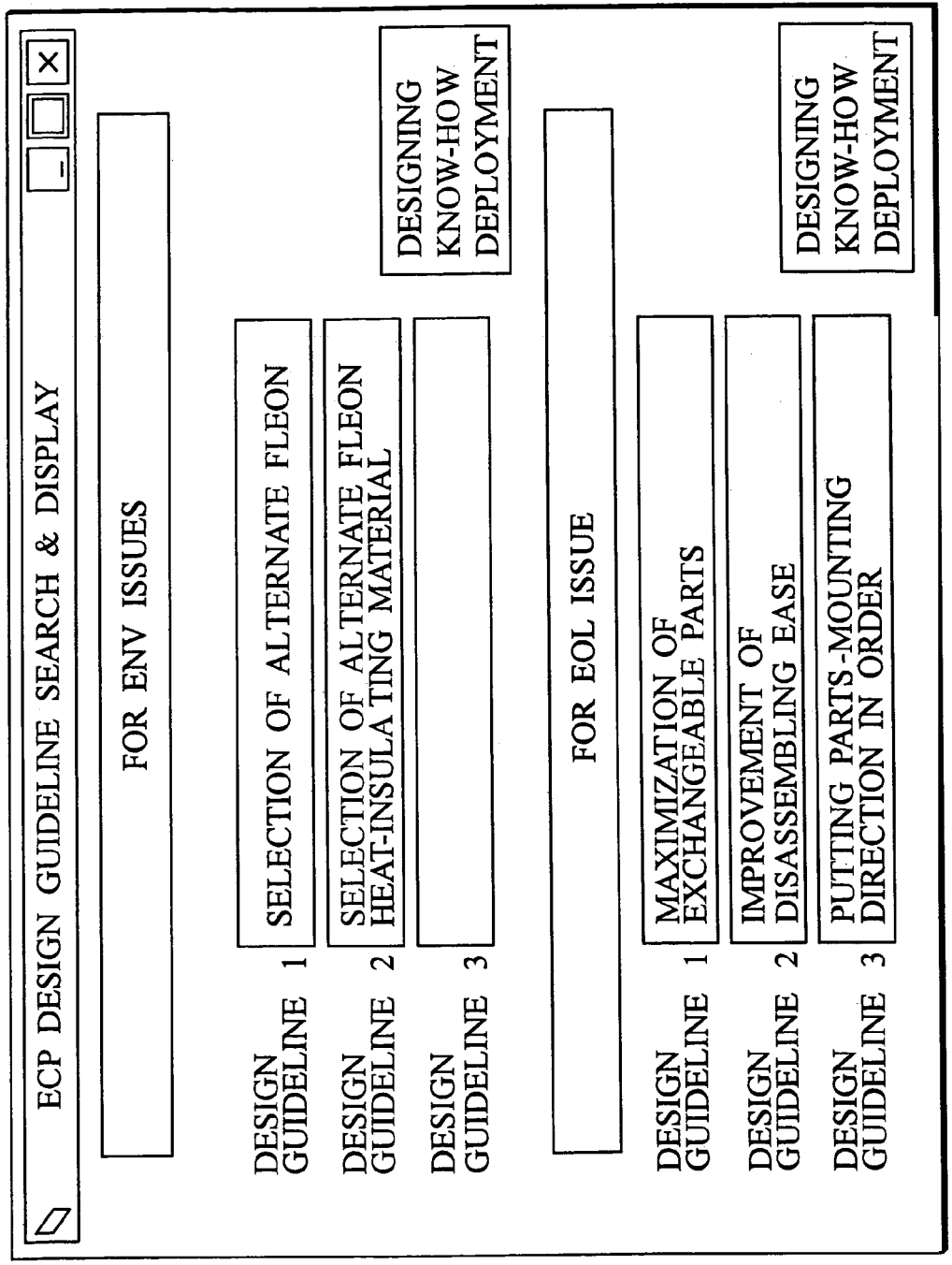
FIG. 23 is a view taken for explaining the present invention, which illustrates an example of displaying a series of ECP design guidelines used in the designing assistance of the present invention.

FIG. 23 illustrates an example wherein the ECP design guidelines have been automatically searched and displayed using the environmental strategy (determination of aimed items of the environmental issues and the EOL issue) as Input data by the designer. In this example, 'selection of alternate fleon refrigerant', 'selection of alternate fleon heat-insulating material' and the like are displayed for the environmental issues from importance of "reduction of influence on the earth environment" or specifically "ozone layer protection", and 'maximization of exchangeable parts', and the like are displayed for the EOL issue from the importance of improvement in "maintenance".

In the system of the present invention, there is provided an ECP detail idea database. The ECP detail idea database is a database that is prepared by collecting as diagrams or figures or as texts various design examples that have been accumulated in the past at the side of a system user who will develop a product by the use of the present system, so as to enable to, for example, refer to or use a past design detail idea at the time of developing a product. Therefore, the designer can refer to the past design detail idea or use the same at the time of developing a product, using this ECP design detail idea database.

FIG. 24 illustrates an example of automatic search and display of the ECP design detail idea for realizing concretely the ECP design guideline "maximization of exchangeable parts" by the use of the ECP design detail idea database. In this example, an evaporator is displayed as an exchangeable design detail idea. Referring to the display example displayed on a display device as in FIG. 24, the designer can have its data taken directly into a designing concept, or may have its data reflected in the designing concept by using its data in a relationship matrix which will be described below.

FIG. 25 illustrates an example wherein the designer selects suitable ones from the ECP design detail idea items that the LCP apparatus 20 displays to apply these suitable ones into the "relationship matrix 3" of FIG. 1. Using this relationship matrix 3, the designer can select the most conformable items from the viewpoint of the environmental strategy, of the technical means that has been deployed from the standpoint of the requirements to the cost and performance of the product by deployment means, e.g. the QFD apparatus 10, etc., and can also use them for a base to form a designing concept that is well balanced in all of the performance, the cost and the environment.

After a designing concept is clarified in this way, the designer produces, as in FIG. 2, a structural model by the use of the CAD apparatus on the basis of this concept. At this time, he selects the materials to be used, by means of the material selection assistant apparatus. Thereafter, he performs design evaluation by the use of various evaluation apparatuses such as an LCA apparatus, an EOL evaluation apparatus. etc. In this connection, it is to be noted that the applicant of the present invention has proposed a LCA apparatus in U.S. Pat. No. 5,852,560, which is one example preferable for application to the designing assistant system of the the present invention. In the evaluation with the evaluation apparatus, it is possible, for the model product of each alternate design solution, to relatively produce product data such as product environmental data regarding various environmental evaluation items like those in the matrix of FIG. 34, in comparison with the data of the self company conventional product, etc. Accordingly, it is also possible to similarly determine the importance levels of the model product by applying the obtained relative product data to the importance level decision procedures described above.

Figure 26:
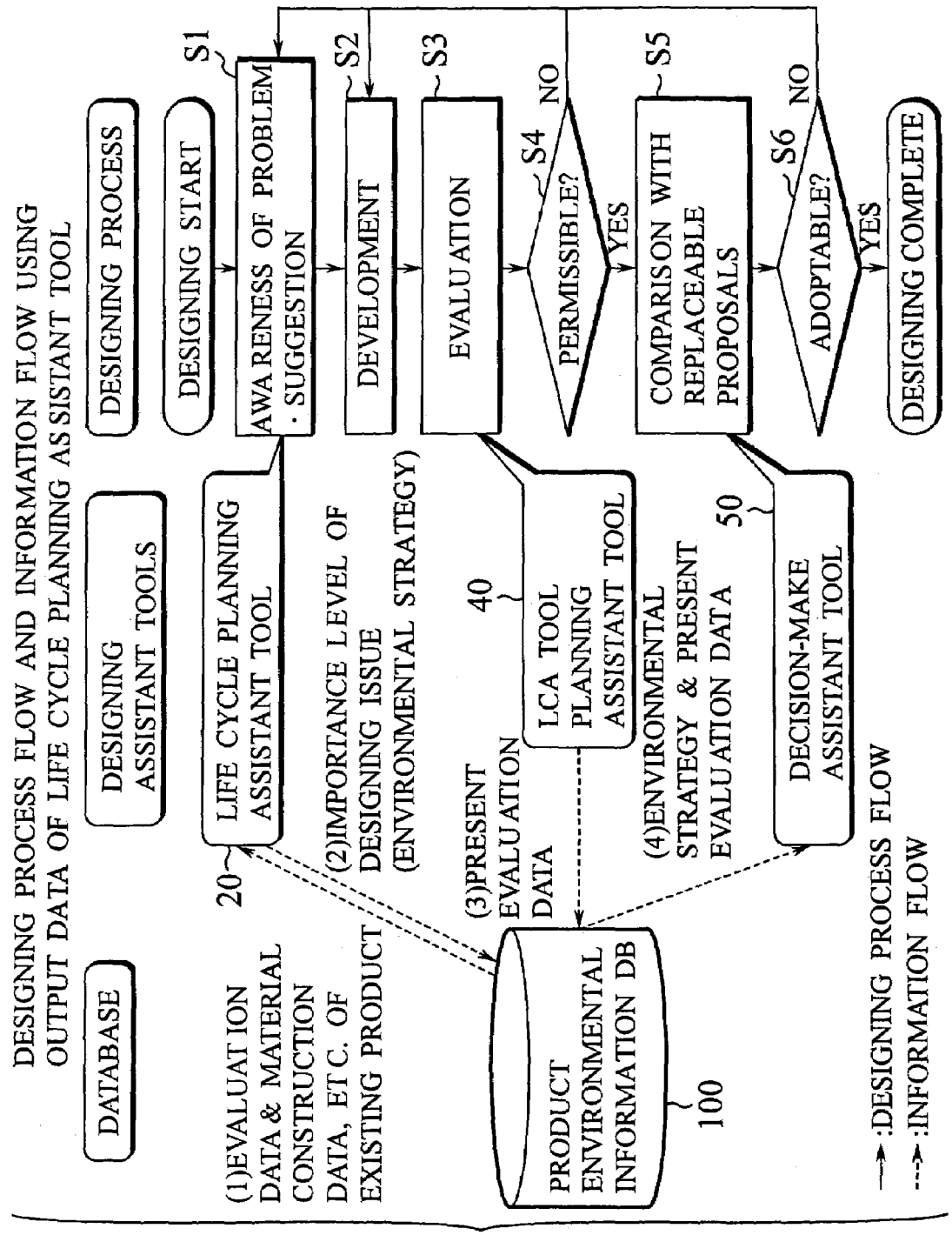
FIG. 26 is a view taken for explaining the present invention, which illustrates the processing flow and the information flow for use in the designing process based on the use of the output data concession from the designing assistant tools.
Figure 27:
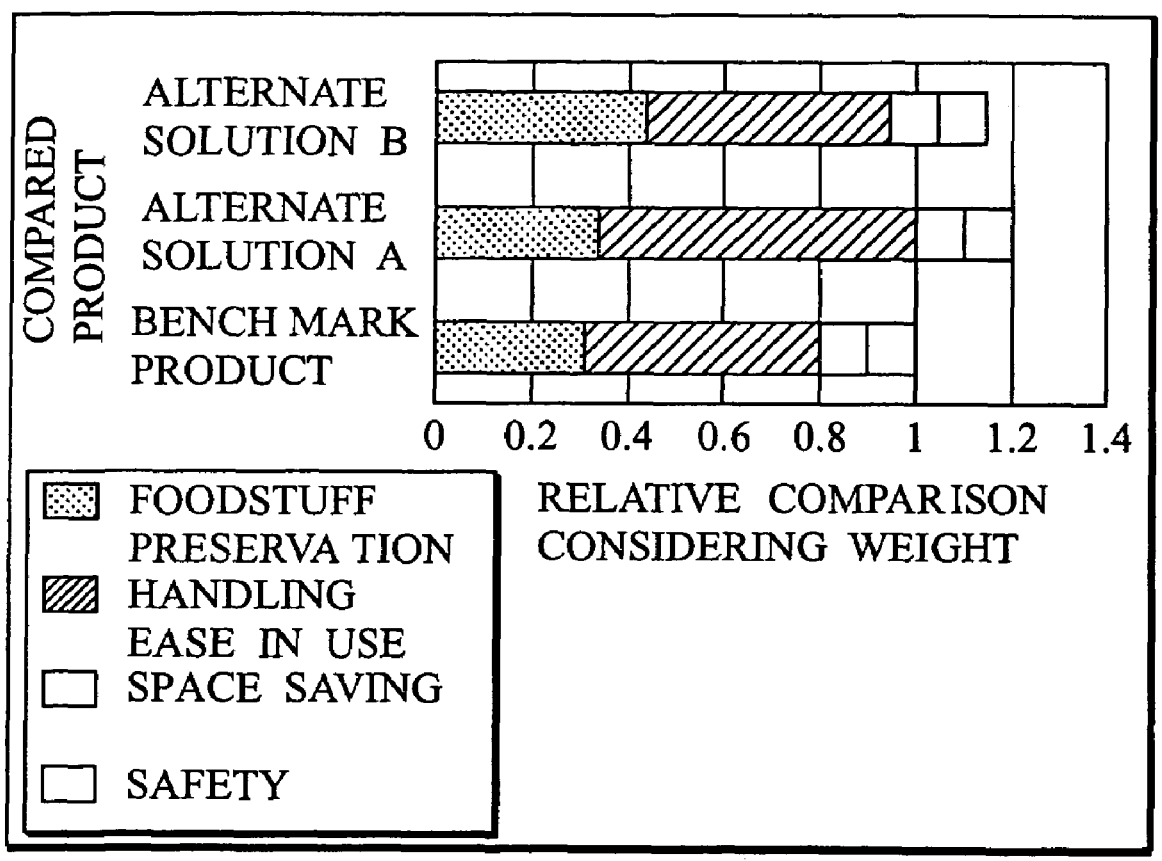
FIG. 27 is a view taken for explaining the present invention, which illustrates an example of a screen image for assisting design determination in the computer-aided designing system of the present invention.
Figure 28:
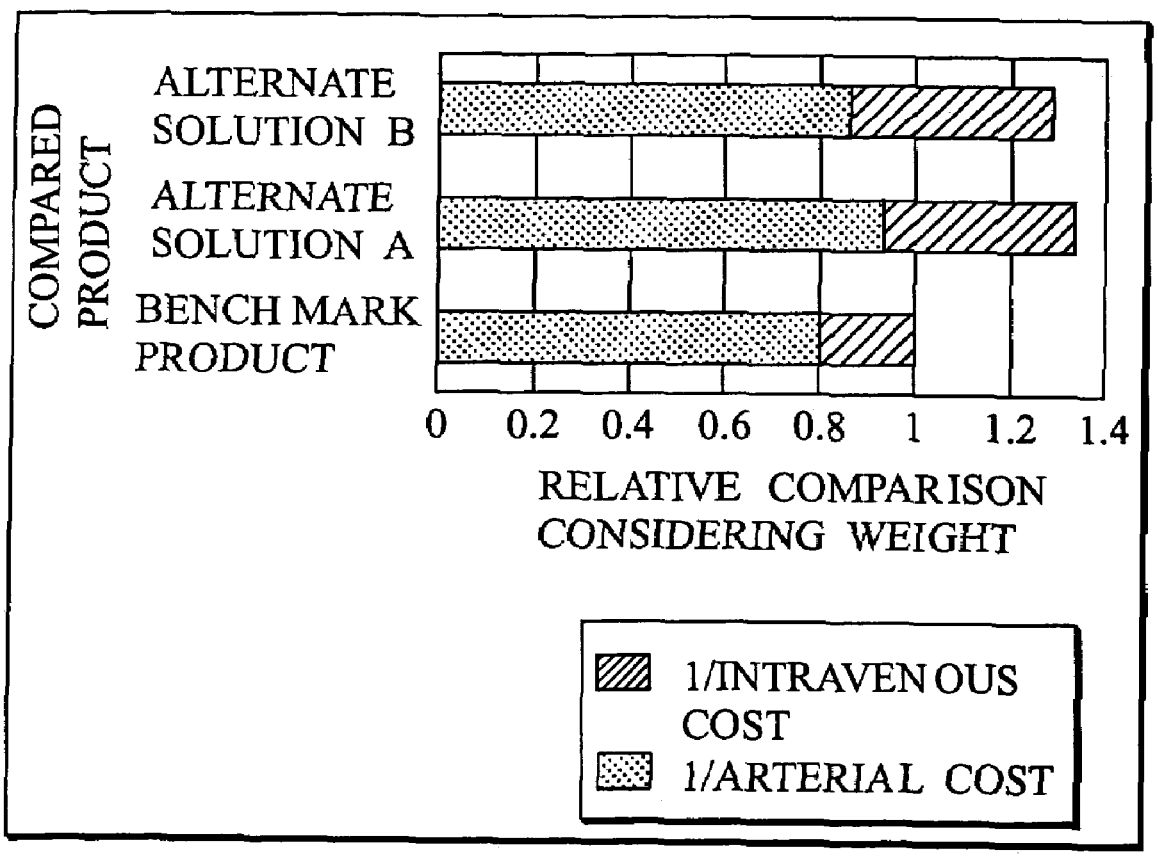
FIG. 28 is a view taken for explaining the present invention, which illustrates an example of another screen image for assisting design determination in the computer-aided designing system of the present invention.

After a few satisfactory alternate design solutions are formed in accordance with the above-described procedures, a decision of a final design output is made using the decision-make assistant unit 40. Specifically, the alternate design plans are compared with one another, using the importance levels obtained from the date on the evaluation items regarding the performance, the cost and the environment, which have been determined using the LCP apparatus 20 and the QFD apparatus 10. (FIG. 26)

Figure 29:
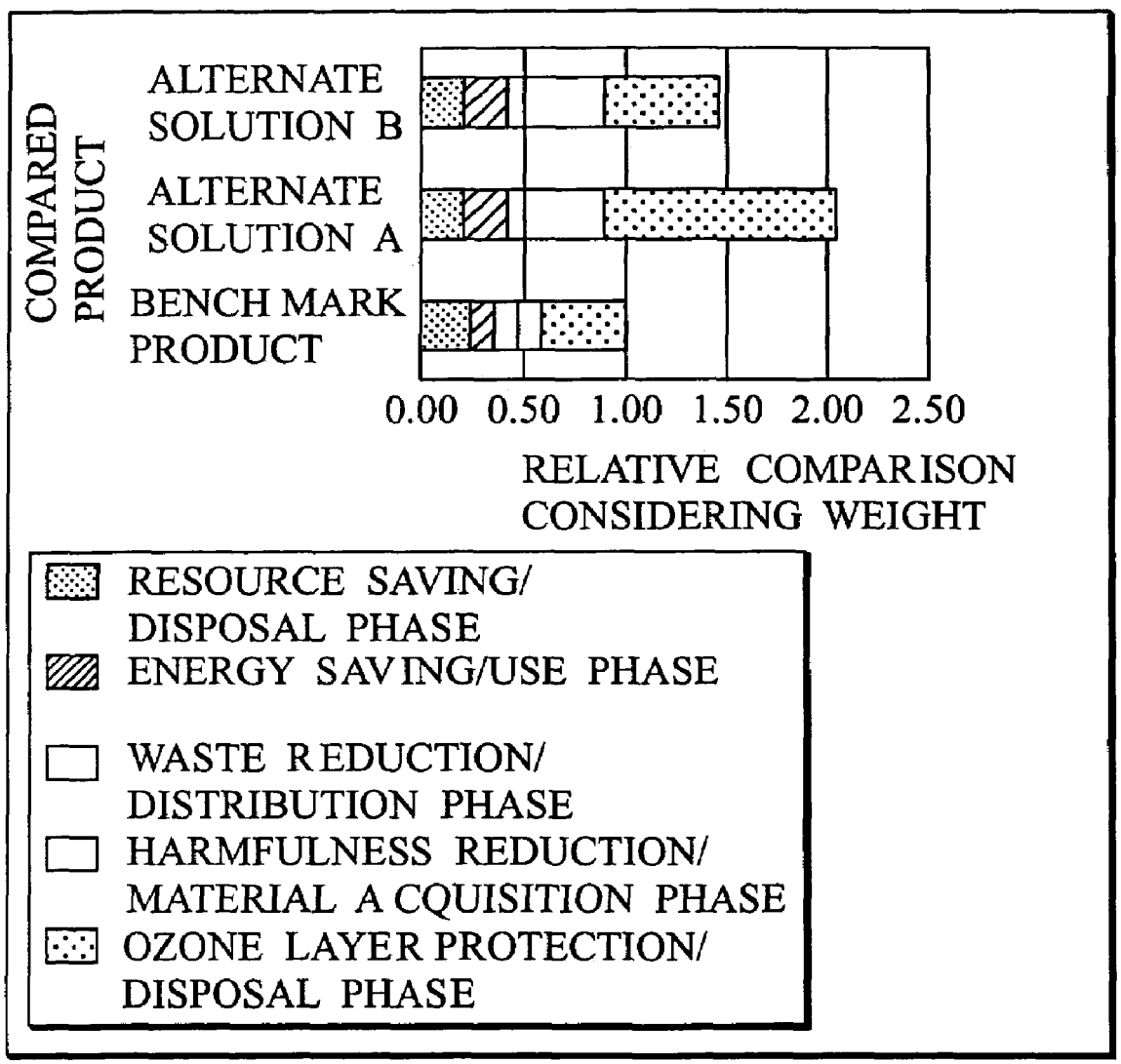
FIG. 29 is a view taken for explaining the present invention, which illustrates an example of the third screen image for assisting design determination in the computer-aided designing system of the present invention.
Figure 30:
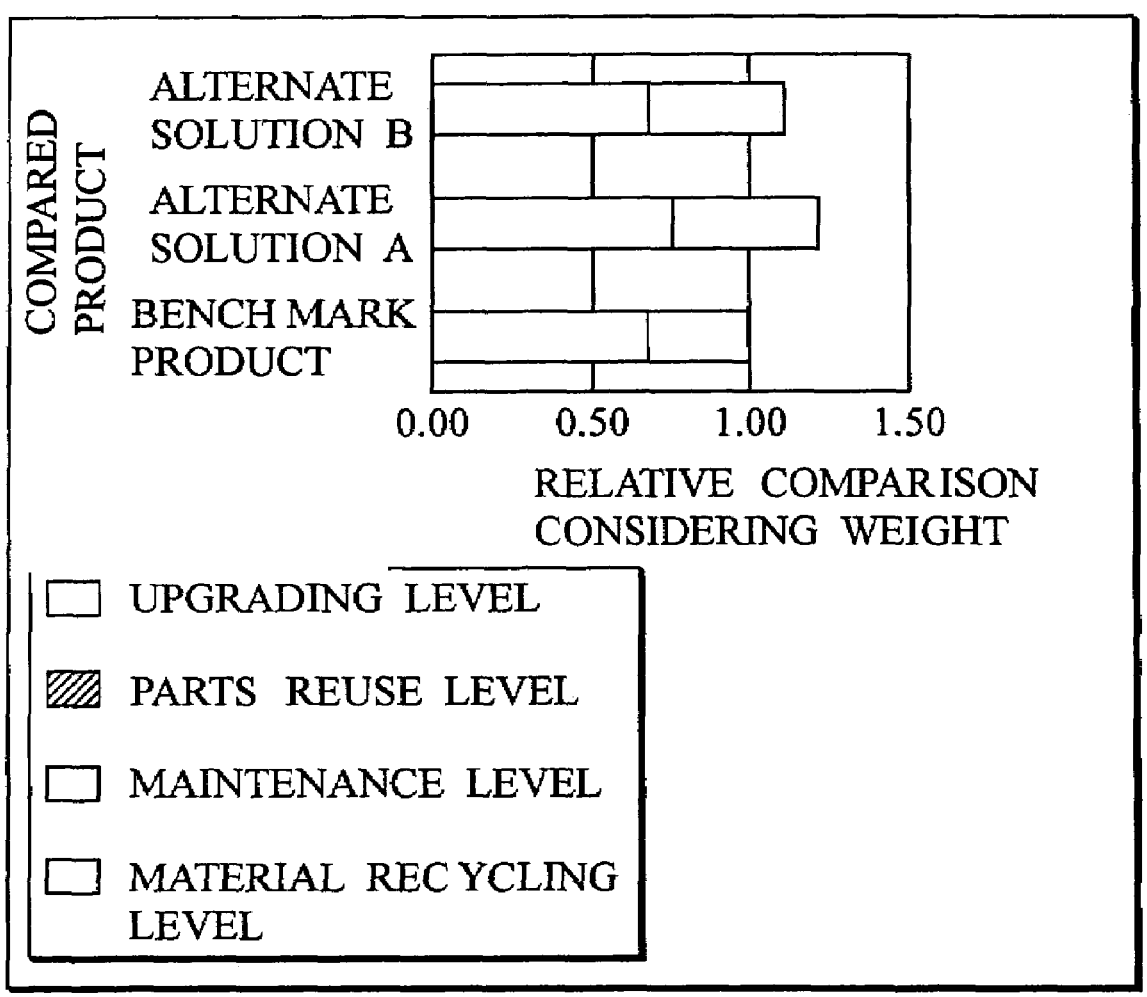
FIG. 30 is a view taken for explaining the present invention, which illustrates an example of the fourth screen image for assisting designing determination in the computer-aided designing system of the present invention.

FIGS. 27 to 30 illustrate examples of display of such comparisons. Here, the importance levels of the aimed items of the bench mark product as shown in FIG. 36A are distributed to the respective evaluation items corresponding to the aimed issue items, to produce a distribution basis. The importance levels of the model product from each alternate design plan obtained in comparison with the bench mark product are similarly distributed to produce a relative distribution, whereby evaluation of the model product of each alternate designing plan relative to the bench mark product is displayed as shown in FIG. 29. For the evaluation items shown in FIGS. 27 and 28, the distribution basis and the relative distribution are obtained by similarly using the importance data or the like obtained in the QFD method. As to FIG. 30, the EOL evaluation is similarly utilized and distribution is made on the obtained importance levels. In this example, since it is clearly displayed that the alternate designing solution A is more excellent than the bench mark product and the alternate designing solution B from all aspects of the performance, cost and environment, the designer can easily adopt the alternate design solution A that realizes the design concept to the largest extent.

<Another Implementation of LCP System>

In FIG. 31, illustration is made schematically of another implementation of the LCP system. This implementation is not different from the first embodiment in that it is equipped with the QFD apparatus 10 and the LCP apparatus 20. However, this implementation is characterized by taking the following procedures. Specifically, in the LCP apparatus 20, assistance of the determination of the aimed EOL issues is executed first, and, in connection with the result of this procedure, assistance of the determination of the importance levels on the environmental issues and the EOL issue is executed. Then the environment strategy is determined (aimed items of the environmental issues and the EOL issue are set) and the ECP design guideline development is performed, thereafter the ECP detail idea development is executed.

Figure 38:
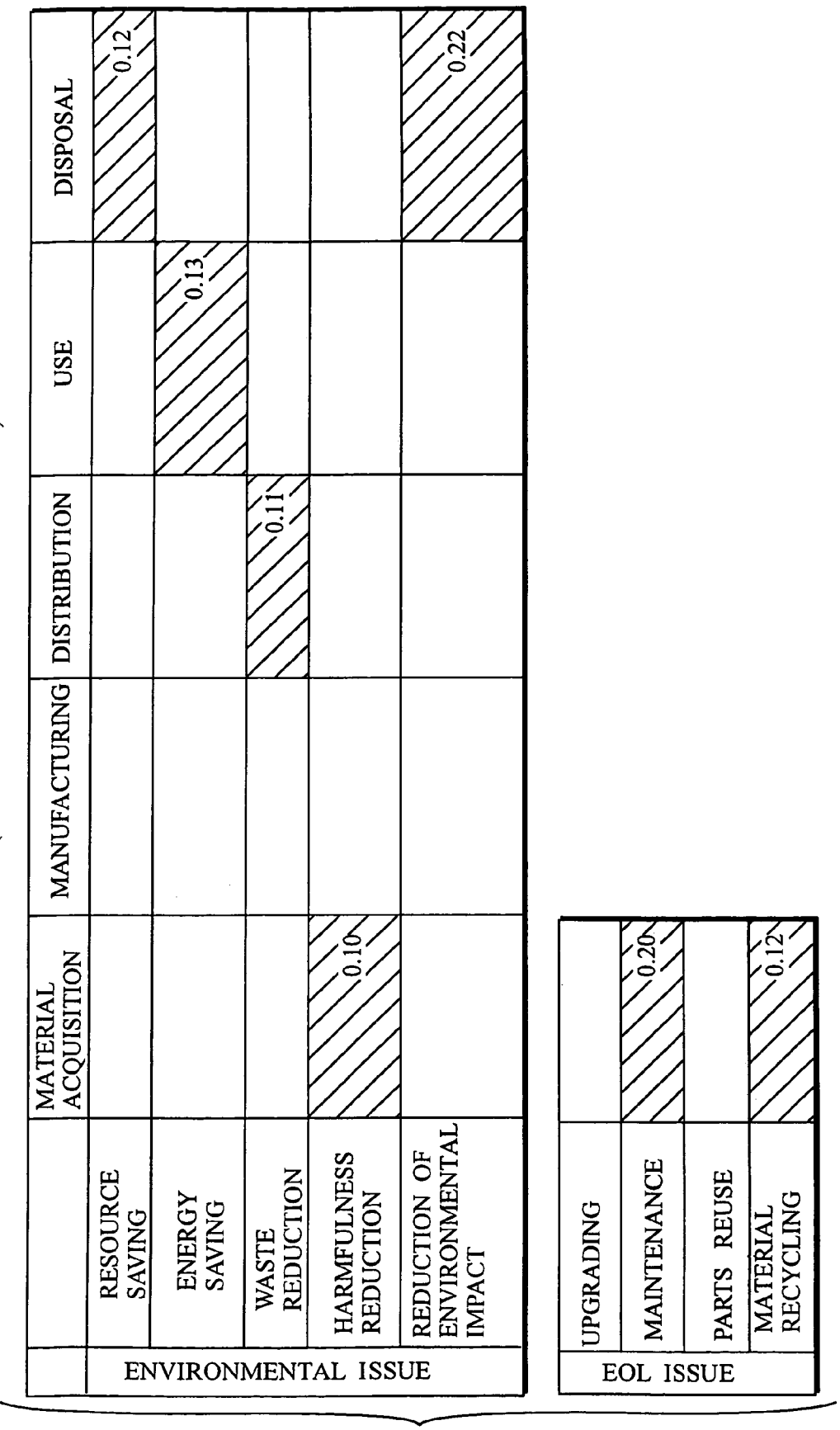
FIG. 38 is a view taken for explaining the present invention, which illustrates an example of the importance level embedding according to said another embodiment of the present invention.

More specifically, the EOL issue items to be aimed at and the sequential priority order thereof are determined first, in the same manner as that have already been explained using FIGS. 11 to 15. Thereafter, the aimed items of the EOL issue and the environmental issues are expressed on a life cycle matrix in which both issues are synthetically systematized in a combined form with each other. Then an importance level is allotted to each of these issue items (FIGS. 37 and 38).

After the above procedure, it is possible to form an ECP design concept in accordance with the same procedures as those which have been explained in connection with FIGS. 17 to 25.

According to the present invention, it is possible, with the trade-off among the performance, the cost of product and the environment being considered in good balance, to produce a designing concept for an environmentally conscious product and a product life cycle process thereof. In addition, with the proceeding of the designing procedures performed using as a base the designing concept that has been clarified at the stage of planning and concept designing, a plurality of designers can easily achieve one design object with no confusion being caused among them.

As has been described above, the system of the present invention is equipped with an environmental quality function deployment database that holds data regarding design guidelines and environmental issues, a product design detail idea database having data on various design examples that has been obtained in the past product development, first assistant means for procuring and presenting design guidelines for designing an environmentally conscious product that is the most suitable for an object product, from the environment quality function deployment database, based on the importance levels allotted to the environmental issues at respective phases of the product life cycle process as well as to the issues to be considered during the product life, and second assistant means for searching an ECP detail idea that realizes the design guideline that is presented by the first assistant means, from the product design detail idea database, and presenting it. Then it is arranged that the first assistant means procures and the design guidelines for forming the environmentally conscious product, that is the most suitable for an object product, from the ECP design guideline database, based on the importance levels that are allotted to the environmental issues at respective phases of the product life cycle process as well as to the issue to be considered during the product life and presents them to the designer. And it has also been arranged that the second assistant means searches an environmentally conscious product design detail idea that realizes the design guideline that is thus presented, from the ECP design detail idea database, and presents it to the designer. As a result of this, it becomes possible to aid the production of the concept of an environmentally conscious product that is the most suitable for an object product.

Also, in addition, by equipping the system with designing means for performing product designing in which the design guideline obtained by the second assistant means has been reflected, evaluation means for performing evaluation of the thus-obtained design result, and decision-make assistant means for procuring aiding data for performing decision-making by comparing this evaluation result with alternate plans, product designing in which the environmentally conscious product design detail idea presented by the second assistant means is reflected by the designing means is performed, the thus-obtained design result is evaluated by the evaluation means, and aiding data for performing decision-making is procured by comparing this evaluation result with alternate solutions by the decision-make assistant means. As a result of this, it becomes possible to easily execute an optimum designing of a product in which importance has been placed on the environmental issues.

Additionally, the present invention is not limited to each of the above-described embodiments and permits various modifications to be suitably made without departing from the subject matter of the invention. Further, the procedures that are described in the embodiments can also be distributed by being stored into recording media such as a magnetic disk (floppy disk, hard disk, etc.), optical disk (CD-ROM. DVD, etc.), semiconductor memory, etc.

According to the present invention, it is possible, with the trade-off among the performance, the product cost and the environment being considered in good balance, to produce a design concept regarding the environmental conscious product and the product life cycle process. In addition, with the proceeding of the designing procedures performed using as a base the designing concept that has been clarified at the stage of planning and concept designing, it is possible to achieve a design object with no confusion being caused among a plurality of designers.

What is claimed is:

1. A computer-aided product designing assistant apparatus for assisting designing of an environmentally conscious product by presenting at least one design guideline to be adopted in designing the environmentally conscious product, the apparatus comprising:

a database storing a plurality of design guidelines for each product and evaluation values assigned to each design guideline in relation to a plurality of environmental issues and a plurality of phases defining a life cycle of products, and also storing additional evaluation values assigned to each design guideline in relation to an EOL (End Of Life) issue, the evaluation values assigned to each design guideline being capable of indicating an effectiveness of each design guideline in resolving each environmental issue at each phase of the life cycle, each environmental issue respectively representing an issue to be resolved in order to reduce environmental impacts due to each product, the additional evaluation values assigned to each design guideline being capable of indicating an effectiveness of each design guideline in resolving the EOL issue, the EOL issue representing an issue to be accounted at an end of a life of each product for realizing recycle or reuse of at least a part of each product in the life cycle; and a processing unit for determining a relative importance level of each environmental issue at each phase of the life cycle for a product to be designed, selecting at least one design guideline regarded as the best for adopting for the product to be designed from said plurality of design guidelines stored in the database according to the evaluation values stored in the database and the relative importance level of each environmental issue at each phase of the life cycle determined for the product to be designed, and presenting said at least one design guideline selected for the product to be designed.

2. The apparatus of claim 1, further comprising:

an additional database storing a product environmental evaluation information for each existing product which indicates an attainment level at which each environmental issue at each phase of the life cycle is resolved in each existing product, wherein the processing unit determines the relative importance level of 30 each environmental issue at each phase of the life cycle according to the product environmental evaluation information stored in the additional database.

3. The apparatus of claim 2, wherein the processing unit determines the relative importance level of each environmental issue at each phase of the life cycle by comparing the product environmental information for one existing product that is to be used as a proto-type of the product to be designed and the product environmental information for another existing product that is to be used as a bench mark product, such that the relative importance level becomes higher for an environmental issue at a phase of the life cycle in which the product environmental evaluation information for said proto-type product is inferior to the product environmental evaluation information for said bench mark product.

4. The apparatus of claim 1, wherein the processing unit also determines a relative importance level of the EOL issue for the product to be designed, selects at least one additional design guideline for the product to be designed from said plurality of design guidelines stored in the database according to the additional evaluation values stored in the database and the relative importance level of the EOL issue determined for the product to be designed, and presents said at least one additional design guideline selected for the product to be designed.

5. The apparatus of claim 1, wherein the processing unit determines a relative importance level of each environmental issue at each phase of the life cycle or the EOL issue for the product to be designed, and selects said at least one design guideline for the product to be designed from said plurality of design guidelines stored in the database according to the evaluation values and the additional evaluation values stored in the database and the relative importance level of each environmental issue at each phase of the life cycle or the EOL issue determined for the product to be designed.

6. The apparatus of claim 1, wherein the processing unit determines the relative importance level of the EOL issue for the product to be designed according to a relationship between a product subjective value based lifetime and a physical useful lifetime of the product to be designed.

7. The apparatus of claim 1, wherein the EOL issue includes issues on upgrading, maintenance, re-manufacturing, parts reuse, and material recycling of the product to be designed.

8. The apparatus of claim 7, wherein the processing unit determines the relative importance level of each issue of the EOL issue for the product to be designed, when the product value based lifetime is represented by lv and the physical lifetime is represented by lu, for the product to be designed, so that:

if $0.5lu < lv < lu$, the relative importance level is higher in the upgrading;

if $lv = lu$, the relative importance level is higher in the material recycling;

if $lu < lv < 2lu$, the relative importance level is higher in the maintenance; and if $2lu \leq lv$, the relative importance level is higher in the material recycling.

9. The apparatus of claim 1, wherein the environmental issues are classified correspondingly to categorization of the environmental load, the environmental impacts are categorized into exhaust of natural resource, waste of energy, increase of waste materials, pollution by harmful matters, and deterioration in the earth environment, and the environmental issues include issues on resource saving, energy saving, waste reduction, harmfulness reduction, and reduction of environmental impacts.

10. The apparatus of claim 1, wherein the phases of the life cycle include a material acquisition phase, a product manufacturing phase, a product distribution phase, a product use phase, and a product disposal phase.

11. The apparatus of claim 1, further comprising:
an ECP detail idea database storing detail ideas data in correspondence to each design guideline;
wherein the processing unit also presents the detail ideas data corresponding to said at least one design guideline selected for the product to be designed.

12. The apparatus of claim 1, wherein the database stores the evaluation values including first evaluation values assigned to each design guideline in relation to the environmental issues and second evaluation values assigned to each design guideline in relation to the phases of the life cycle, and
the processing unit selects said at least one design guideline for the product to be designed by calculating a point of each design guideline given by a product of a first evaluation value with respect to each environmental issue, a second evaluation value with respect to each phase of the life cycle, and the relative importance level of each environmental issue at each phase of the life cycle, and summed over all the environmental issues and all the phases of the life cycle.

13. The apparatus of claim 1, wherein the processing unit manages the environmental issues and the phases of the life cycle in a form of a matrix defined by the environmental issues and the phases of the life cycle.

14. The apparatus of claim 13, wherein the processing unit receives an input specifying selected elements of the matrix from a designer, and gives non-zero values for relative importance levels of those environmental issues at those phases of the life cycle which correspond to the selected elements of the matrix.

15. The apparatus of claim 1, further comprising:
a Quality Function Deployment unit for carrying out a Quality Function Deployment method with respect to the product to be designed and presenting at least one design guideline to be adopted for the product to be designed in designing a product competitive in market and technically acceptable.

\* \* \* \* \*